(12) United States Patent
Wen et al.

(10) Patent No.: US 12,156,394 B2
(45) Date of Patent: Nov. 26, 2024

(54) SRAM STRUCTURE AND METHOD FOR FORMING THE SAME

(71) Applicant: Taiwan Semiconductor Manufacturing Co., Ltd., Hsinchu (TW)

(72) Inventors: Ming-Chang Wen, Kaohsiung (TW); Kuo-Hsiu Hsu, Zhongli (TW); Jyun-Yu Tian, Hsinchu (TW); Wan-Yao Wu, Hsinchu (TW); Chang-Yun Chang, Taipei (TW); Hung-Kai Chen, Taichung (TW); Lien Jung Hung, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 212 days.

(21) Appl. No.: 17/728,236

(22) Filed: Apr. 25, 2022

(65) Prior Publication Data
US 2022/0254789 A1   Aug. 11, 2022

Related U.S. Application Data

(62) Division of application No. 16/376,257, filed on Apr. 5, 2019, now Pat. No. 11,315,933.

(60) Provisional application No. 62/692,226, filed on Jun. 29, 2018.

(51) Int. Cl.
*H10B 10/00* (2023.01)
(52) U.S. Cl.
CPC .................. *H10B 10/12* (2023.02)

(58) Field of Classification Search
CPC ........ H10B 10/12; H10B 10/18; H10B 99/00; H01L 27/0924; H01L 21/823878; H01L 21/823892; H01L 21/823821; H01L 27/0207; H01L 21/823871
See application file for complete search history.

(56) References Cited

U.S. PATENT DOCUMENTS

| 8,772,109 B2 | 7/2014 | Colinge |
| 8,785,285 B2 | 7/2014 | Tsai et al. |
| 8,816,444 B2 | 8/2014 | Wann et al. |

(Continued)

FOREIGN PATENT DOCUMENTS

| JP | S62286268 | 12/1987 |
| JP | 2014027279 | 2/2014 |

(Continued)

*Primary Examiner* — Shahed Ahmed
*Assistant Examiner* — Sun Mi Kim King
(74) *Attorney, Agent, or Firm* — HAYNES AND BOONE, LLP

(57) ABSTRACT

SRAM structures are provided. An SRAM structure includes a substrate, a P-type well region over the substrate, an N-type well region over the substrate, a PMOS transistor in the N-type well region, an NMOS transistor in the P-type well region, an isolation region over the boundary between the P-type well region and the N-type well region, and a dielectric structure formed in the isolation region and extending from the isolation region to the boundary between the P-type well region and the N-type well region. The depth of the dielectric structure is greater than that of the isolation region. The PMOS transistor is separated from the NMOS transistor by the isolation region.

20 Claims, 32 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,899,267 B1 * | 2/2018 | Liou ............... H01L 21/823481 |
| 2013/0292777 A1 * | 11/2013 | Liaw ................... G11C 11/412 |
| | | 257/369 |
| 2016/0181425 A1 * | 6/2016 | Bai .................... H01L 27/1211 |
| | | 438/283 |
| 2016/0225674 A1 * | 8/2016 | Jacob ............... H01L 29/66545 |
| 2017/0005165 A1 | 1/2017 | Chen et al. |
| 2018/0151553 A1 | 5/2018 | Liaw |
| 2019/0393324 A1 | 12/2019 | Chen |

FOREIGN PATENT DOCUMENTS

| | | |
|---|---|---|
| KR | 20170004827 | 1/2017 |
| TW | 200605079 | 2/2006 |
| TW | 200818469 | 4/2008 |
| TW | 201421272 | 6/2014 |

\* cited by examiner

SRAM STRUCTURE AND METHOD FOR FORMING THE SAME

CROSS REFERENCE TO RELATED APPLICATIONS

This application is a divisional application of U.S. patent application Ser. No. 16/376,257, filed Apr. 5, 2019, which claims priority of U.S. Provisional Application No. 62/692,226, filed on Jun. 29, 2018, each of which is incorporated by reference herein in its entirety.

BACKGROUND

Memories are commonly used in integrated circuits. For example, a static random access memory (SRAM) is a volatile memory, and is used in electronic applications where high speed, low power consumption, and simplicity of operation are needed. Embedded SRAM is particularly popular in high-speed communications, image processing, and system-on-chip (SOC) applications. SRAM has the advantage of being able to hold data without requiring a refresh.

SRAM includes a plurality of bit cells disposed in rows and columns to form an array. Each bit cell includes a plurality of transistors coupled to bit lines and word lines that are used to read and write a bit of data to the memory cell. Single-port SRAMs enable a single bit of data to be written to or read from a bit cell at a particular time.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
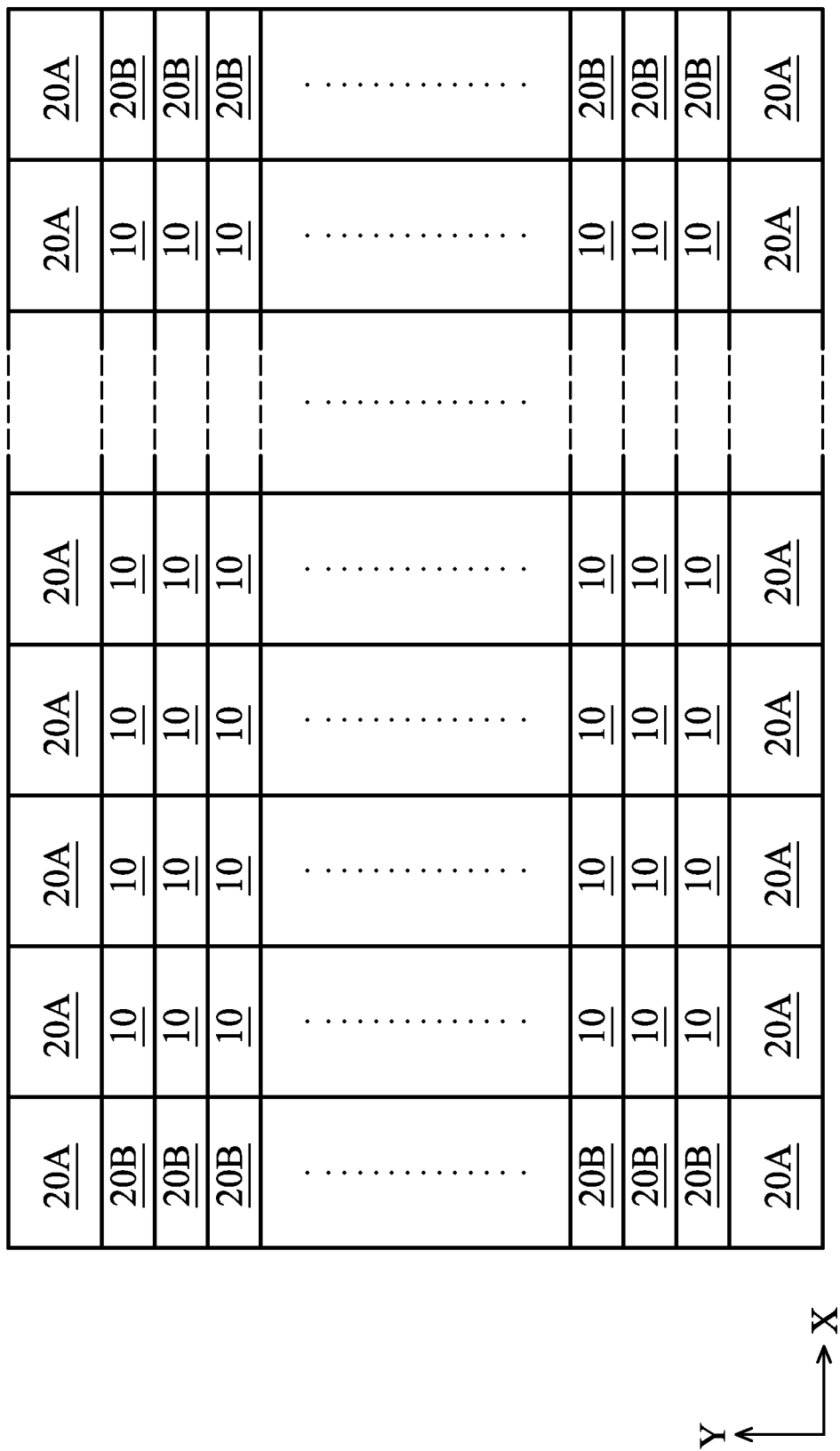
FIG. 1 illustrates a simplified diagram of an SRAM, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various static random access memory (SRAM) structures are provided in accordance with various exemplary embodiments. Some variations of some embodiments are discussed.

Throughout the various views and illustrative embodiments, like reference numbers are used to designate like elements.

FIG. 1 illustrates a simplified diagram of an SRAM 30, in accordance with some embodiments of the disclosure. The SRAM 30 can be an independent device or be implemented in an integrated circuit (e.g. System-on-Chip (SOC)). The SRAM 30 includes a cell array formed by multiple SRAM cells (or called bit cells) 10, and the SRAM cells 10 are arranged in multiple rows and multiple columns in the cell array.

In the fabrication of SRAM cells, the cell array may be surrounded by multiple strap cells 20A and multiple edge cells 20B, and the strap cells 20A and the edge cells 20B are dummy cells for the cell array. In some embodiments, the strap cells 20A are arranged to surround the cell array horizontally, and the edge cells 20B are arranged to surround the cell array vertically. The shapes and sizes of the strap cells 20A and the edge cells 20B are determined according to actual application. In some embodiments, the shapes and sizes of the strap cells 20A and the edge cells 20B are the same as the SRAM cells 10. In some embodiments, the shapes and sizes of the strap cells 20A, the edge cells 20B and the SRAM cells 10 are different.

In the SRAM 30, each SRAM cell 10 has the same rectangular shape/region, e.g., the widths and heights of the SRAM cells 10 are the same. The configurations of the SRAM cells 10 are described below.

Figure 2A:
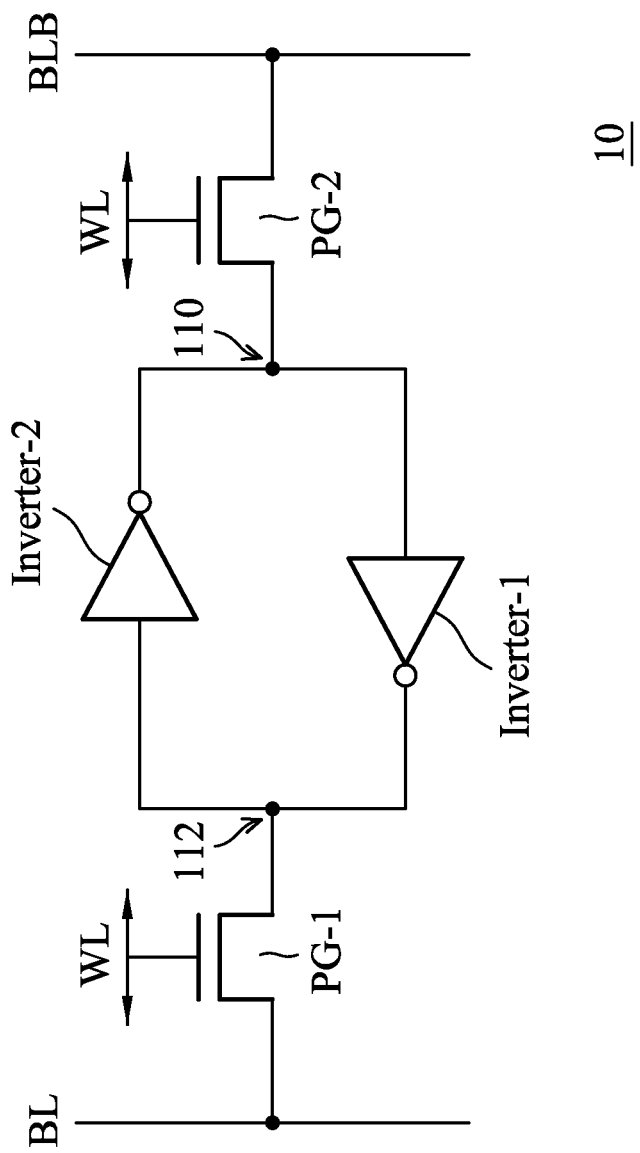
FIG. 2A illustrates a single-port SRAM cell, in accordance with some embodiments of the disclosure.

FIG. 2A illustrates a single-port SRAM cell 10, in accordance with some embodiments of the disclosure. The bit cell 10 includes a pair of cross-coupled inverters Inverter-1 and Inverter-2, and two pass-gate transistors PG-1 and PG-2. The inverters Inverter-1 and Inverter-2 are cross-coupled between the nodes 112 and 110, and form a latch. The pass-gate transistor PG-1 is coupled between a bit line BL and the node 112, and the pass-gate transistor PG-2 is coupled between a complementary bit line BLB and the node 110, wherein the complementary bit line BLB is complementary to the bit line BL. The gates of the pass-gate transistors PG-1 and PG-2 are coupled to the same word-line WL. Furthermore, the pass-gate transistors PG-1 and PG-2 may be NMOS transistors.

Figure 2B:
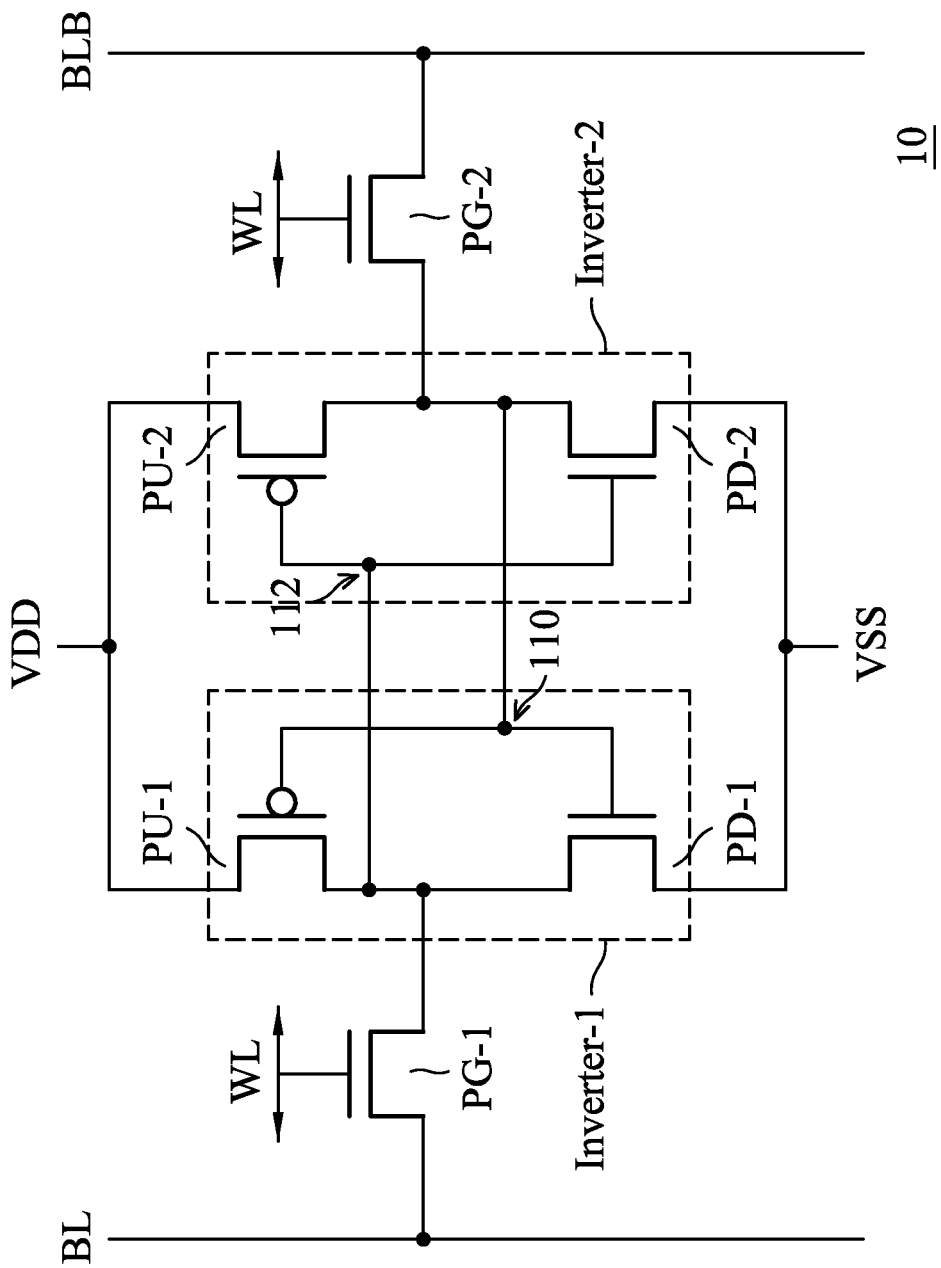
FIG. 2B illustrates an alternative illustration of the SRAM cell of FIG. 2A, in accordance with some embodiments of the disclosure.

FIG. 2B illustrates an alternative illustration of the SRAM cell 10 of FIG. 2A, in accordance with some embodiments of the disclosure. The inverter Inverter-1 in FIG. 2A includes a pull-up transistor PU-1 and a pull-down transistor PD-1, as shown in FIG. 2B. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node 112 connecting the pass-gate transistor PG-1. The gates of the pull-up transistor PU-1 and the pull-down transistor PD-1 are coupled to the node 110 connecting the pass-gate transistor PG-2. Furthermore, the source of the pull-up transistor PU-1 is coupled to the power supply node VDD, and the source of the pull-down transistor PD-1 is coupled to a ground VSS.

Similarly, the inverter Inverter-2 in FIG. 2A includes a pull-up transistor PU-2 and a pull-down transistor PD-2, as shown in FIG. 2B. The pull-up transistor PU-2 is a PMOS transistor, and the pull-down transistor PD-2 is an NMOS transistor. The drains of the pull-up transistor PU-2 and the pull-down transistor PD-2 are coupled to the node 110 connecting the pass-gate transistor PG-2. The gates of the pull-up transistor PU-2 and the pull-down transistor PD-2 are coupled to the node 112 connecting the pass gate transistor PG-1. Furthermore, the source of the pull-up transistor PU-2 is coupled to the power supply node VDD, and the source of the pull-down transistor PD-2 is coupled to the ground VSS.

In some embodiments, the pass-gate transistors PG-1 and PG-2, the pull-up transistors PU-1 and PU-2, and the pull-down transistors PD-1 and PD-2 of the SRAM cell 10 are fin field effect transistors (FinFETs).

In some embodiments, the pass-gate transistors PG-1 and PG-2, the pull-up transistors PU-1 and PU-2, and the pull-down transistors PD-1 and PD-2 of the SRAM cell 10 are planar MOS devices.

A latch-up is a type of short circuit which can occur in the SRAM cells 10 of the SRAM 30. More specifically it is the inadvertent creation of a low-impedance path that causes high currents to be conducted between the power supply VDD and the ground VSS via a parasitic structure (e.g. a PNPN structure) in the SRAM 30. Latch-up may cause the SRAM 30 to cease functioning and even to be destroyed. The parasitic PNPN structure acts as a PNP transistor and an NPN transistor stacked next to each other. When one of the PNP and NPN transistors is conducting, the other one begins conducting too, and an undesired latch-up occurs. Then the PNP and NPN transistors keep each other in saturation for as long as the structure is forward-biased and high current flows through the parasitic PNPN structure.

Figure 3A:
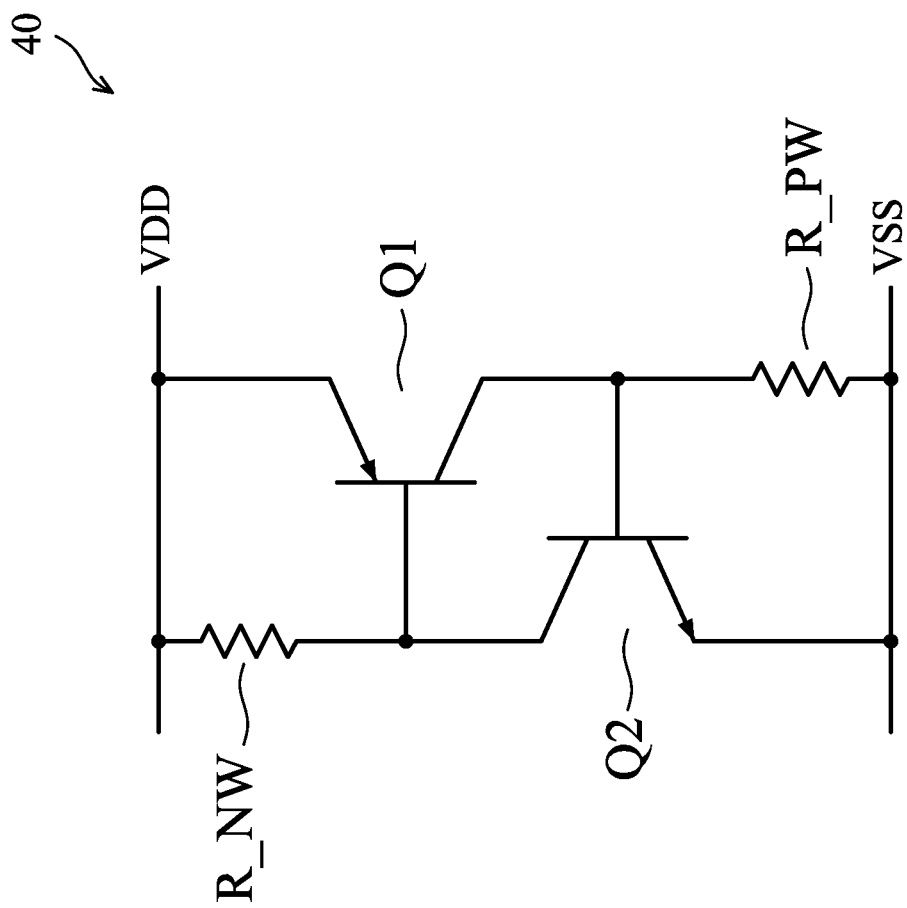
FIG. 3A illustrates an equivalent circuit of a semiconductor-controlled rectifier (SCR) in each SRAM cell of FIG. 1.
Figure 3B:
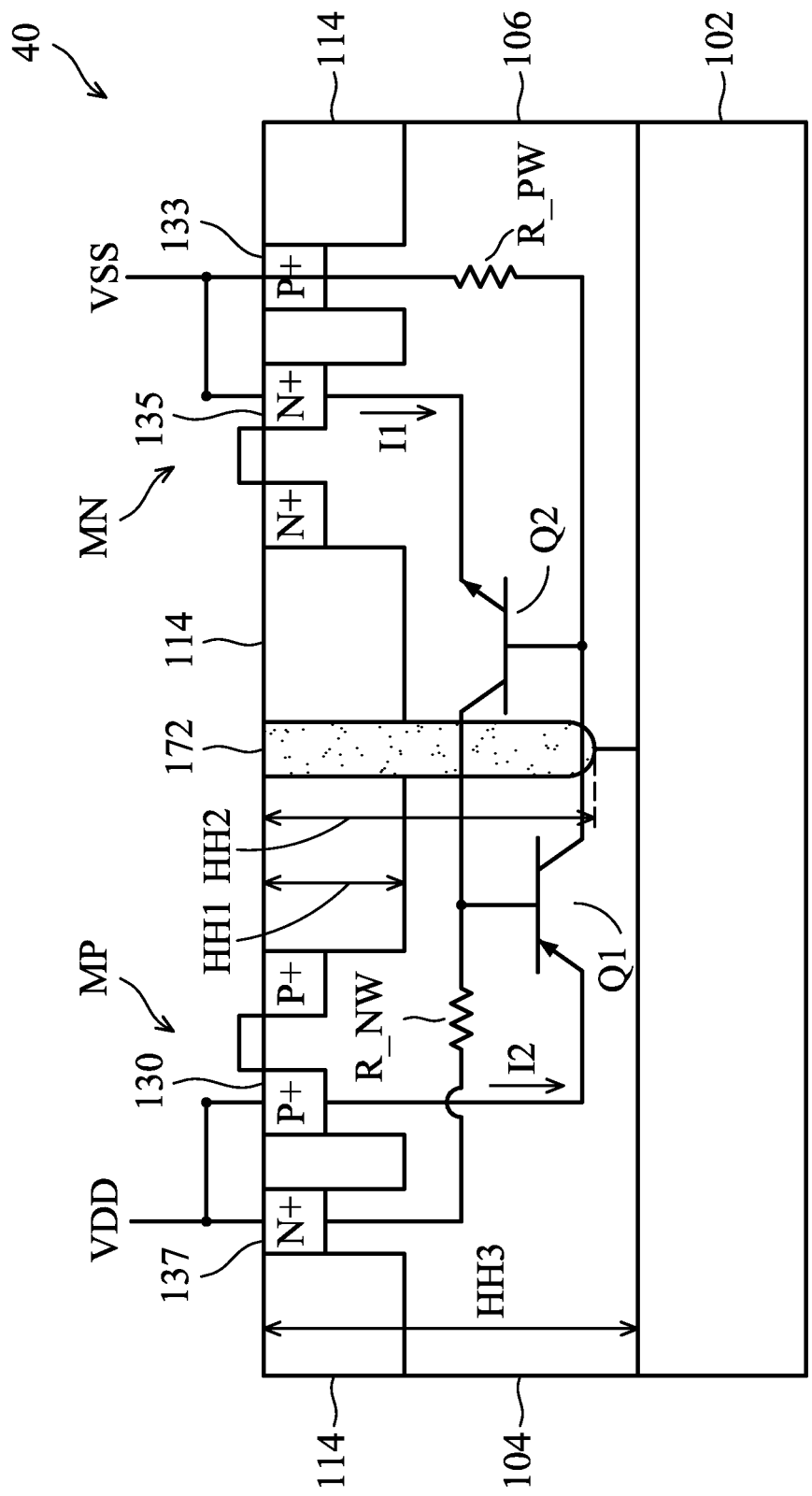
FIG. 3B illustrates a cross-sectional view illustrating the SCR of FIG. 3A, in accordance with some embodiments of the disclosure.

FIG. 3A illustrates an equivalent circuit of a semiconductor-controlled rectifier (SCR) 40 in each SRAM cell 10 of FIG. 1, and FIG. 3B illustrates a cross-sectional view illustrating the SCR 40 of FIG. 3A, in accordance with some embodiments of the disclosure.

Referring to FIG. 3A and FIG. 3B together, the P-type well region 106 and the N-type well region 104 are formed on a substrate 102. In some embodiments, the substrate 102 is a P-type substrate, e.g., Si substrate. A PMOS transistor MP of the SRAM cell 10 is formed on the N-type well region 104, and an NMOS transistor MN of the SRAM cell 10 is formed on the P-type well region 106. Furthermore, the N-type well pick-up region 137 forms bulk terminal of the PMOS transistor MP, and the P-type well pick-up region 133 forms bulk terminal of the NMOS transistor MN.

In such embodiments, the PMOS transistor MP and the NMOS transistor MN are planar transistors. Furthermore, the PMOS transistor MP may be the pull-up transistor PU-1 or PU-2 of the SRAM cell 10_1, and the NMOS transistor MN may be the pass-gate transistor PG-1 or PG-2 or the pull-down transistor PD-1 or PD-2 of the SRAM cell 10.

A parasitic PNP transistor Q1 is shown with an emitter formed by the P+ region 130 (i.e., source of the PMOS transistor MP), a base formed by the N-type well region 104, and a collector formed by the P-type well region 106 and/or the substrate 102. The base of the PNP transistor Q1 is coupled to the N-type well pick-up region 137 through the resistor R_NW. The N-type well pick-up region 137 is an electrical connection made by an N-type region on the N-type well region 104, and the N-type well pick-up region 137 is configured to connect to a power supply node VDD. The resistor R_NW is a parasitic component (intrinsic resistance) of the N-type well region 104. The collector of the PNP transistor Q1 is coupled to the P-type well pick-up region 133 through a resistor R_PW. The P-type well pick-up region 133 is an electrical connection made by a P-type region on the P-type well region 106, and the P-type well pick-up region 133 is configured to connect to a ground VSS. The resistor R_PW is a parasitic component (intrinsic resistance) of the P-type well region 106. In some embodiments, the collector of the PNP transistor Q1 is coupled to the P-type well pick-up region 133 through the resistor R_PW and a parasitic resistor (not shown) of the substrate 102.

A parasitic NPN transistor Q2 is shown with an emitter formed by the N+ region 135 (i.e., source of the NMOS transistor MN), a base formed by the P-type well region 106 and/or the substrate 102, and a collector formed by the N-type well region 104.

If the PNP transistor Q1 or the NPN transistor Q2 is turned on when one of the PN junctions in the transistor Q1/Q2 is forward-biased, this may cause unwanted latch-up in the SRAM structure 10 and, in some cases, even permanently damage the SRAM cell 10.

In FIG. 3B, the NMOS transistor MN and the PMOS transistor MP is separated by an isolation region 114 (or an isolation layer 114), such as a shallow trench isolation (STI). Furthermore, a dielectric structure 172 is formed and extends from the isolation region 114 to the P-type well region 106 and the N-type well region 104, i.e., the dielectric structure 172 penetrates the isolation region 114. In some embodiments, the depth HH1 of the isolation region 114 is less than the depth HH2 of the dielectric structure 172, and the depth HH2 of the dielectric structure 172 is less than the depth HH3 of the P-type well region 106 and the N-type well region 104, i.e., HH1<HH2<HH3. Furthermore, material of the dielectric structure 172 is different from the isolation region 114.

In some embodiments, the dielectric structure 172 forms a barrier between the collector of the parasitic NPN transistor Q2 and the base of the parasitic NPN transistor Q1 and between the collector of the parasitic NPN transistor Q1 and the base of the parasitic NPN transistor Q2. By selecting the refill material of the dielectric structure 172, a first leakage current I1 from the N+ region 135 to the N-type well region 104 and/or a second leakage current I2 from the P+ region 130 to the P-type well region 106 are changed.

In some embodiments, the dielectric structure 172 includes the refill material having positive charge, such as SiN, SiOCN or SiON. The refill material having positive charge can induce negative charge in the P-type well region 106 and the N-type well region 104. The negative charge in the P-type well region 106 and the N-type well region 104 can increase the first leakage current I1 from the N+ region 135 to the N-type well region 104. Furthermore, the second leakage current I2 from the P+ region 130 to the P-type well region 106 is decreased. Thus, a trigger voltage of the SCR is increased by the decreased second leakage current I2. If the parasitic PNP transistor Q1 is turned on by the first leakage current I1, the parasitic NPN transistor Q2 is still turned off due to the higher trigger voltage, thereby improving latch up of the SRAM cell 10. In some embodiments, when the positive charge of the dielectric structure 172 is increased, the second leakage current I2 is decreased. Thus, better latch up prevention is provided.

In some embodiments, the dielectric structure 172 includes the refill material having negative charge, such as SiO2 with plasma or implant. The refill material having negative charge can induce positive charge in the P-type well region 106 and the N-type well region 104. The positive charge in the P-type well region 106 and the N-type well region 104 can decrease the first leakage current I1 from the N+ region 135 to the N-type well region 104. Furthermore, the second leakage current I2 from the P+ region 130 to the P-type well region 106 is increased. Thus, a trigger voltage of the SCR is increased by the decreased first leakage current I1. If the parasitic NPN transistor Q2 is turned on by the second leakage current I2, the parasitic PNP transistor Q1 is still turned off due to the higher trigger voltage, thereby improving latch up of the SRAM cell 10. In some embodiments, when the negative charge of the dielectric structure 172 is increased, the first leakage current I1 is decreased. Thus, better latch up prevention is provided.

In some embodiments, the dielectric structure 172 includes the neutral refill material, such as silicon oxides (SiO$_X$). By using the neutral refill material, the refill material having positive charge and/or the refill material having negative charge, the amount of charge within the dielectric structure 172 can be modified, such that the first leakage current I1 and the second leakage current I2 can be controlled to provide better latch up prevention in the memory cell 10.

Similarly, the dielectric structure 172 can be implemented in a logic cell, such as a standard cell. For example, the dielectric structure 172 is formed at the boundary (or junction, interface) between the P-type well region and the N-type well region of the logic cell. Thus, better latch up prevention is provided in the logic cell.

Figure 4:
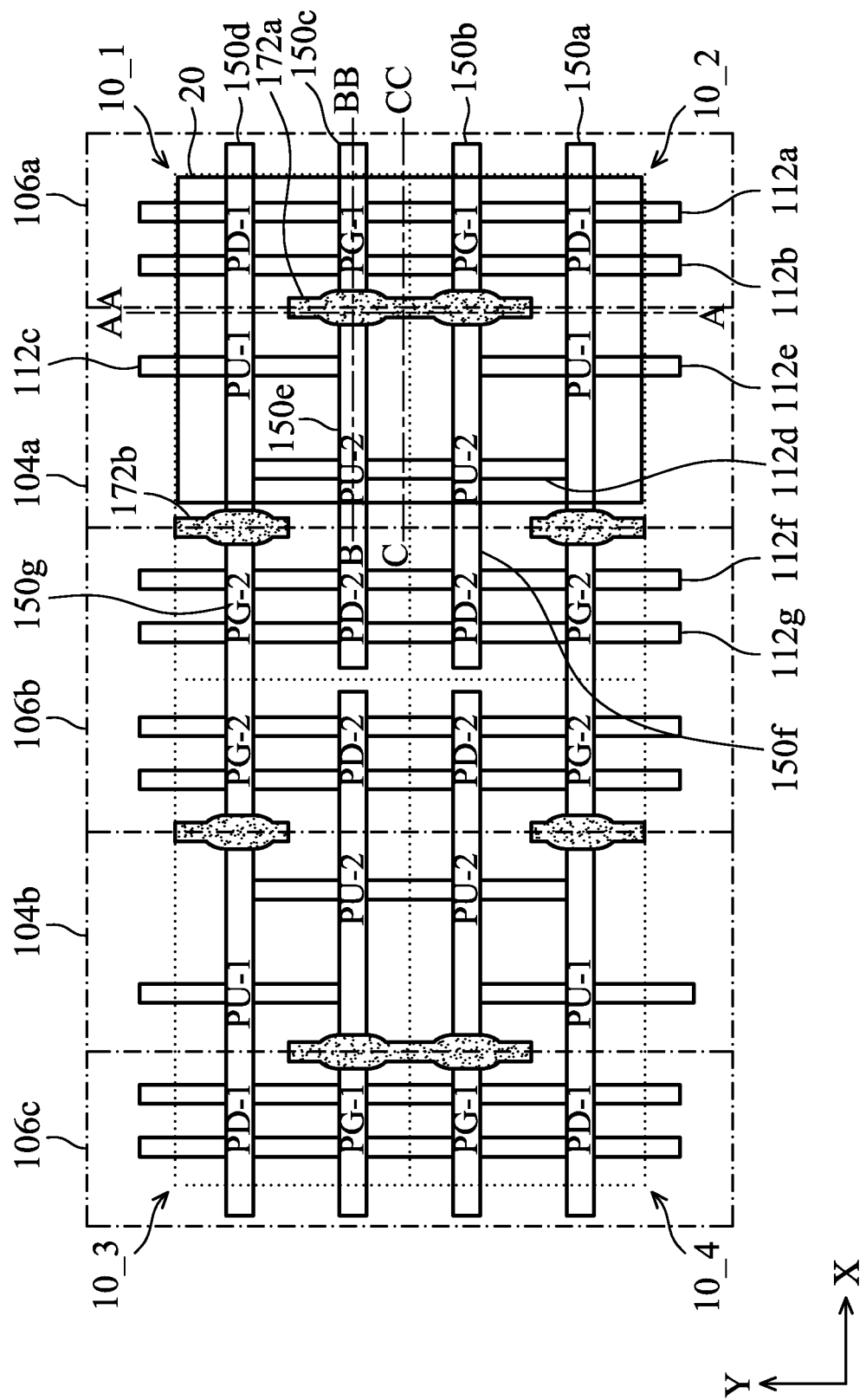
FIG. 4 illustrates a layout illustrating an SRAM structure of SRAM cells, in accordance with some embodiments of the disclosure.

FIG. 4 illustrates a layout illustrating an SRAM structure of SRAM cells 10_1 through 10_4, in accordance with some embodiments of the disclosure. In such embodiments, the transistors within the SRAM cells 10_1, 10_2, 10_3 and 10_4 are fin transistors in the N-type well regions 104a and 104b and the P-type well regions 106a through 106c. The N-type well region 104b is positioned between the P-type well regions 106b and 106c, and the N-type well region 104a is positioned between the P-type well regions 106a and 106b.

The two adjacent SRAM cells 10_1 and 10_3 are arranged in the same row of the cell array of the SRAM 30. The two adjacent SRAM cells 10_1 and 10_2 are arranged in the same column of the cell array of the SRAM 30. The two adjacent SRAM cells 10_3 and 10_4 are arranged in the same column of the cell array of the SRAM 30. In other words, the two adjacent SRAM cells 10_2 and 10_4 are arranged in the same row of the cell array of the SRAM 30. In FIG. 4, each of the SRAM cells 10_1, 10_2, 10_3 and 10_4 has the same rectangular shape/region with a width and a height, and the height is less than the width. It should be noted that the SRAM structure shown in FIG. 4 is merely an example and is not intended to limit the SRAM cells 10 of the SRAM 30.

In the SRAM 30, the semiconductor fin structures may be patterned using any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the semiconductor fin structures.

In SRAM cell 10_1, the pass-gate transistor PG-1 is formed at the cross point of the fin structures 112a and 112b and the gate structure 150c on the P-type well region 106a. The pull-down transistor PD-1 is formed at the cross point of the fin structures 112a and 112b and the gate structure 150d on the P-type well region 106a. The pass-gate transistor PG-2 is formed at the cross point of the fin structures 112g and 112f and the gate structure 150g on the P-type well region 106b. The pull-down transistor PD-2 is formed at the cross point of the fin structures 112g and 112f and the gate structure 150e on the P-type well region 106b. The pull-up transistor PU-1 is formed at the cross point of the fin structure 112c and the gate structure 150d on the N-type well region 104a. The pull-up transistor PU-2 is formed at the cross point of the fin structure 112d and the gate structure 150e on the N-type well region 104a. In such embodiments, the pull-down transistors PD-1 and PD-2 and the pass-gate transistors PG-1 and PG-2 are the dual-fin transistors, and the pull-up transistors PU-1 and PU-2 are the single-fin transistors.

Various contacts and their corresponding interconnect vias may be employed to couple components in each SRAM cells 10_1 through 10_4. Through a via and a gate contact, a word line (WL) contact (not shown) may be coupled to the gate of pass-gate transistor PG-1 through the gate structure 150c, and another word line contact WL is coupled to the gate of pass-gate transistor PG-2 through the gate structure 150g. Likewise, a bit line (BL) contact (not shown) is coupled to the drain of pass-gate transistor PG-1, and a complementary bit line contact BLB is coupled to the drain of pass-gate transistor PG-2.

A power source contact (not shown) coupled to the power supply node VDD is coupled to the source of the pull-up transistor PU-1, and another power source contact (not shown) coupled to the power supply node VDD is coupled to the source of the pull-up transistor PU-2. A ground contact (not shown) coupled to the ground VSS is coupled to the source of the pull-down transistor PD-1, and another ground contact (not shown) coupled to the ground VSS is coupled to the source of the pull-down transistor PD-2.

In such embodiments, the SRAM cell 10_2 is a duplicate cell for the SRAM cell 10_1 but flipped over the X axis. Furthermore, the SRAM cell 10_3 is a duplicate cell for the SRAM cell 10_1 but flipped over the Y axis. Moreover, the SRAM cell 10_4 is a duplicate cell for the SRAM cell 10_3 but flipped over the X axis. The common contacts (e.g., BL, VDD, and VSS), are combined to save space.

The gate structure 150d is shared by the pull-up transistor PU-1 and the pull-down PD-1 of the SRAM cell 10_1, and the gate structure 150g is shared by the pass-gate transistors PG-2 of the SRAM cells 10_1 and 10_2. A dielectric structure 172b is formed over a boundary (or a junction, interface) between the P-type well region 106b and the N-type well region 104a, and the gate electrodes 150d and 150g are separated by the dielectric structure 172b, i.e., the dielectric structure 172b is a gate-cut structure for the gate structures 150d and 150g. In some embodiments, the gate-cut structure is formed by a cut metal gate (CMG) process. The gate structure 150e is shared by the pull-up transistor PU-2 and the pull-down PD-2 of the SRAM cell 10_1. A dielectric structure 172a is formed over a boundary (or a junction, interface) between the P-type well region 106a and the N-type well region 104a, and the gate electrodes 150c and 150e are separated by the dielectric structure 172a, i.e., the dielectric structure 172a is a gate-cut structure for the gate structures 150c and 150e. In some embodiments, the gate-cut structure is formed by a CMG process.

Figure 5A:
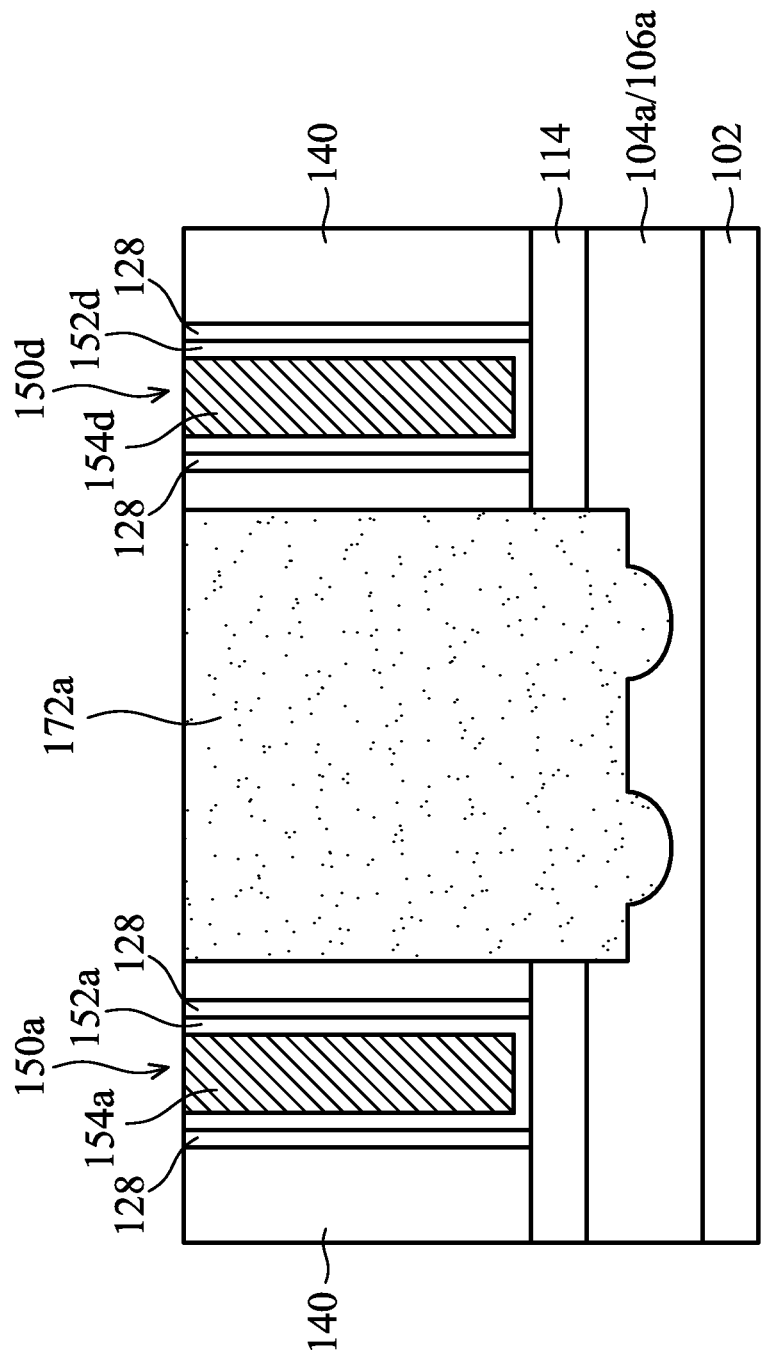
FIG. 5A illustrates a cross-sectional view of the SRAM structure of the SRAM cells along section line A-AA view of FIG. 4, in accordance with some embodiments of the disclosure.

FIG. 5A illustrates a cross-sectional view of the SRAM structure of the SRAM cells 10_1 and 10_2 along section line A-AA view of FIG. 4, in accordance with some embodiments of the disclosure. The P-type well region 106a and the N-type well region 104a are formed on a substrate 102. In some embodiments, the substrate 102 is a Si substrate. An isolation region 114 is formed over the P-type well region 106a and the N-type well region 104a. In some embodiments, the isolation region 114 is shallow trench isolation (STI) region.

InterLayer Dielectric (ILD) layer 140 is formed over the isolation region 114. In some embodiments, the interlayer dielectric layer 140 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

The gate structures 150a and 150d are formed over the isolation region 114, and the gate structures 150a and 150d are surrounded by the interlayer dielectric layer 140. The gate structure 150a includes a gate electrode layer 154a and a gate dielectric layer 152a, and the gate structure 150d includes a gate electrode layer 154d and a gate dielectric layer 152d. In some embodiments, the gate electrode layers 154a and 154d are made of a conductive material, such as aluminum (Al), copper (Cu), tungsten (W), titanium (Ti), tantalum (Ta), or another applicable material. Gate spacers 128 are formed on the sidewalls of the gate structures 150a and 150d.

The dielectric structure 172a has a depth greater than sum of depths of the isolation region 114 and the interlayer dielectric layer 140. In other words, the dielectric structure 172a is extend to the P-type well region 106 and the N-type well region 104 and passes through the isolation region 114. As described above, the isolation region 114 and the dielectric structure 172a are made of different materials.

Figure 5B:
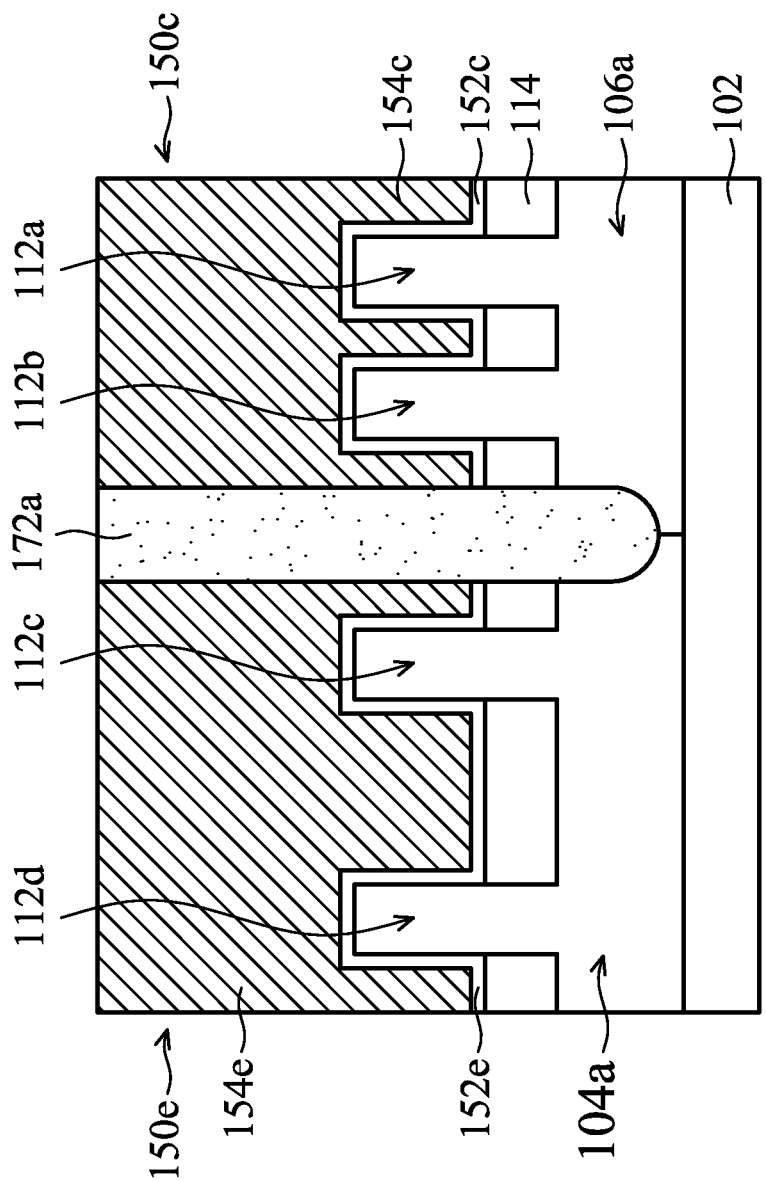
FIG. 5B illustrates a cross-sectional view of the SRAM structure of the SRAM cell along section line B-BB view of FIG. 4, in accordance with some embodiments of the disclosure.

FIG. 5B illustrates a cross-sectional view of the SRAM structure of the SRAM cell 10_1 along section line B-BB view of FIG. 4, in accordance with some embodiments of the disclosure. The P-type well region 106a and the N-type well region 104a are formed on the substrate 102. The fin structures 112a and 112b are formed on the P-type well region 106a, and the fin structures 112c and 112d are formed on the N-type well region 104a. The isolation region 114 is formed over the P-type well region 106a and the N-type well region 104a. The fin structures 112a through 112d are separated by the isolation region 114.

The gate dielectric layer 152e is formed over the isolation region 114 and the fin structures 112c and 112d. The gate electrode layer 154e is formed over the gate dielectric layers 152e and is positioned over a top surface of the semiconductor fin structures 112c and 112d. The gate electrode layer 154e and the gate dielectric layer 152e over the semiconductor fin structure 112d form a gate structure for the pull-up transistor PU-2. Furthermore, the gate dielectric layer 152c is formed over the isolation region 114 and the fin structures 112a and 112b. The gate electrode layer 154c is formed over the gate dielectric layers 152c and is positioned over a top surface of the semiconductor fin structures 112b and 112a. The gate electrode layer 154c and the gate dielectric layer 152c over the semiconductor fin structures 112a and 112b form a gate structure for the pass-gate transistor PG-1. In FIG. 5B, the gate dielectric layers 152e and 152c are separated by the dielectric structure 172a, and the gate electrode layers 154e and 154c are separated by the dielectric structure 172a.

Figure 5C:
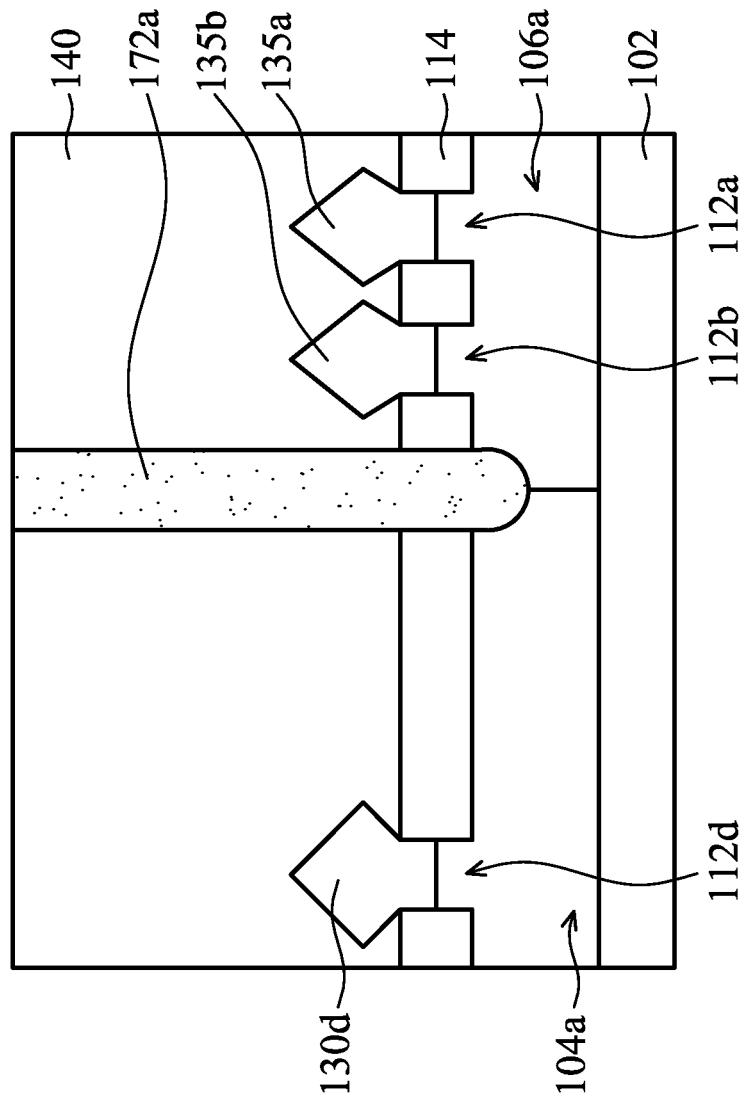
FIG. 5C illustrates a cross-sectional view of the SRAM structure of the SRAM cells along section line C-CC view of FIG. 4, in accordance with some embodiments of the disclosure.

FIG. 5C illustrates a cross-sectional view of the SRAM structure of the SRAM cells 10_1 and 10_2 along section line C-CC view of FIG. 4, in accordance with some embodiments of the disclosure. The P-type well region 106a and the N-type well region 104a are formed on the substrate 102. The fin structures 112a and 112b are formed on the P-type well region 106a, and the fin structure 112d is formed on the N-type well region 104a. The isolation region 114 is formed over the P-type well region 106a and the N-type well region 104a. The fin structures 112a, 112b and 112d are separated by the isolation region 114.

The source/drain structure 130d form the source/drain region on the fin structure 112d. In some embodiments, the source/drain structure 130d is a P-type epitaxy (EPI) structure. The source/drain structure 135b form the source/drain region on the fin structure 112b, and the source/drain structure 135a form the source/drain region on the fin structure 112a. In some embodiments, the source/drain structures 135a and 135b are N-type EPI structures. The interlayer dielectric layer 140 is formed over the isolation region 114, the source/drain structure 130d and the source/drain structures 135a and 135b.

In some embodiments, the material of the source/drain structure 130d includes epitaxy material. The epitaxy material is selected from a group consisting of SiGe content, SiGeC content, Ge-content, or a combination thereof.

In some embodiments, the material of the source/drain structures 135a and 135b includes epitaxy material. The epitaxy material is selected from a group consisting of SiP content, SiC content, SiPC, SiAs, Si, or a combination thereof.

FIGS. 6A to 6E illustrate perspective views of various stages of manufacturing a semiconductor structure shown in block 20 in FIG. 4 in accordance with some embodiments. FIGS. 7A to 7E illustrate cross-sectional representations of various stages of manufacturing the semiconductor structure shown along line A-AA in FIG. 4, and FIGS. 8A to 8E illustrate cross-sectional representations of various stages of manufacturing the semiconductor structure shown along line B-BB in FIG. 4 in accordance with some embodiments.

Figure 6A:
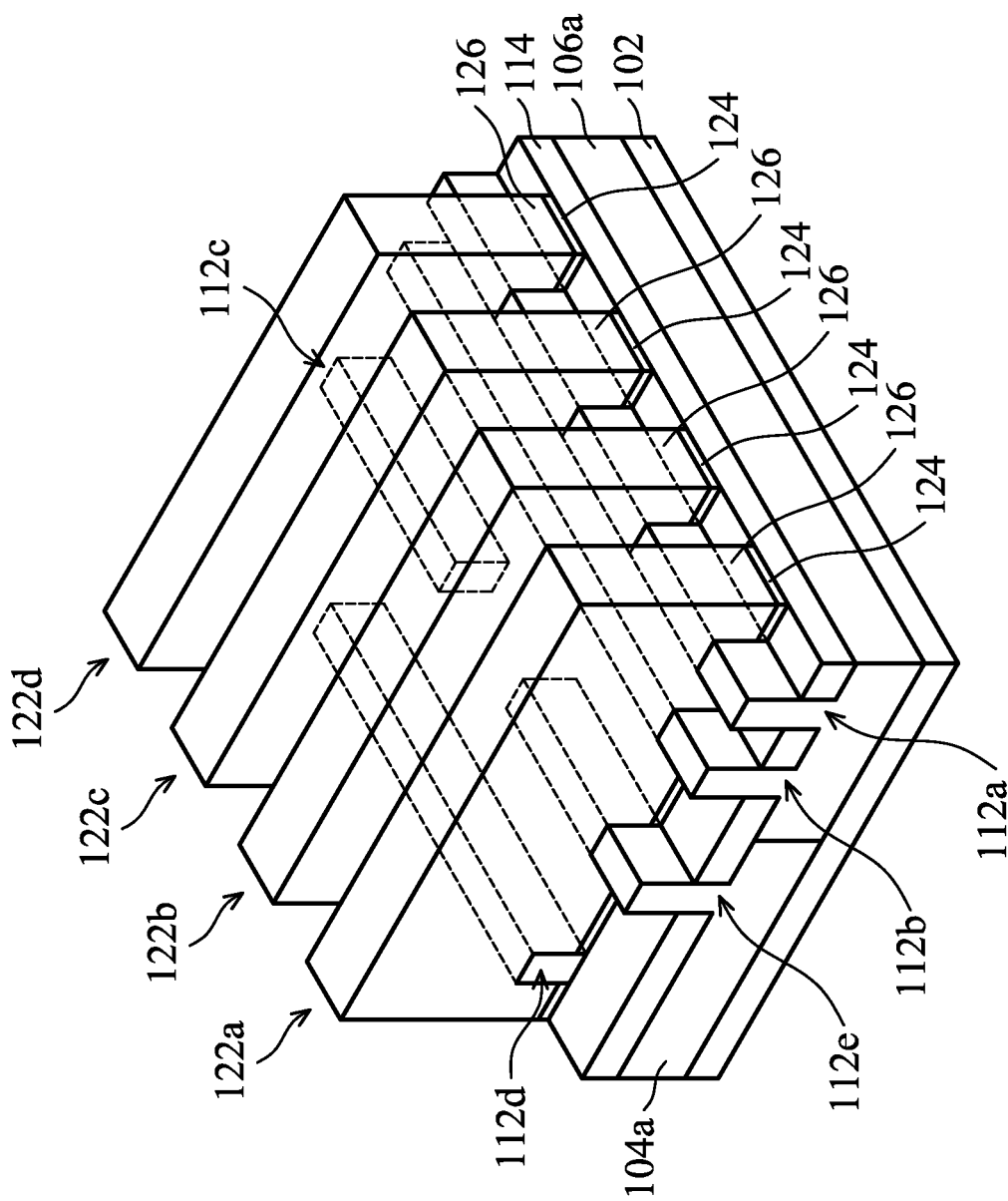
FIGS. 6A to 6E illustrate perspective views of various stages of manufacturing a semiconductor structure shown in block 20 in FIG. 4 in accordance with some embodiments.
Figure 7A:
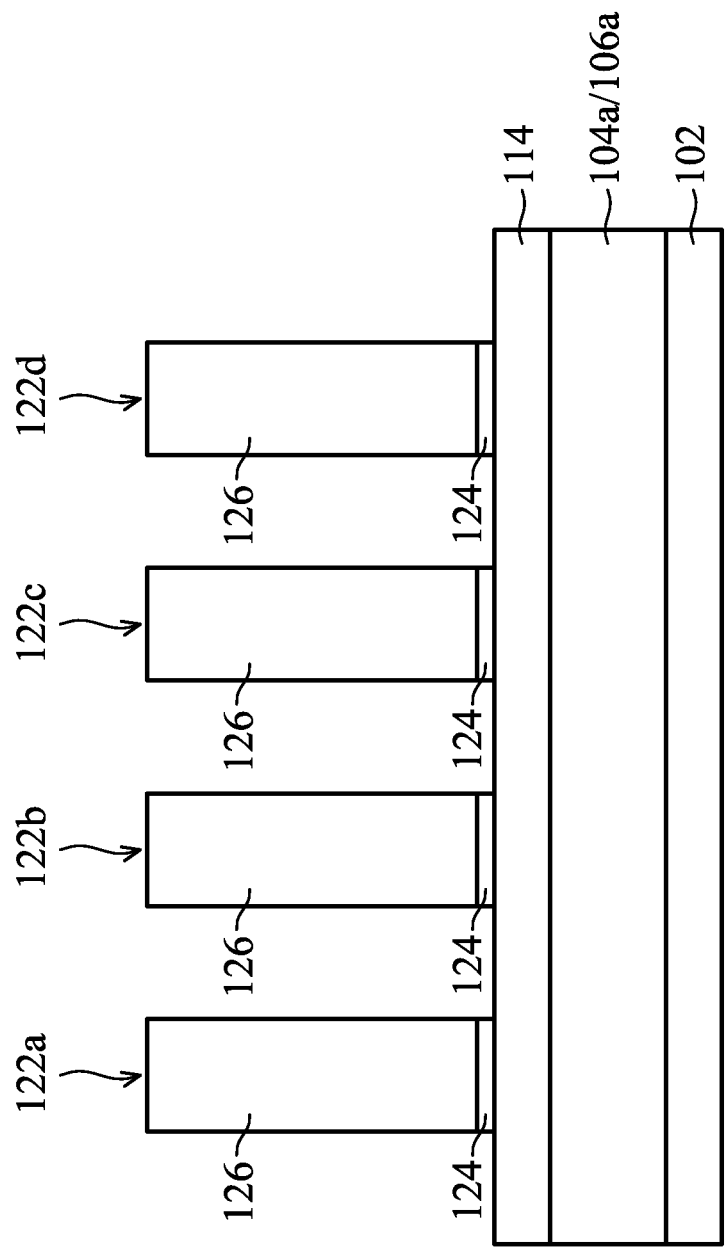
FIGS. 7A to 7E illustrate cross-sectional representations of various stages of manufacturing the semiconductor structure shown along line A-AA in FIG. 4 in accordance with some embodiments.
Figure 8A:
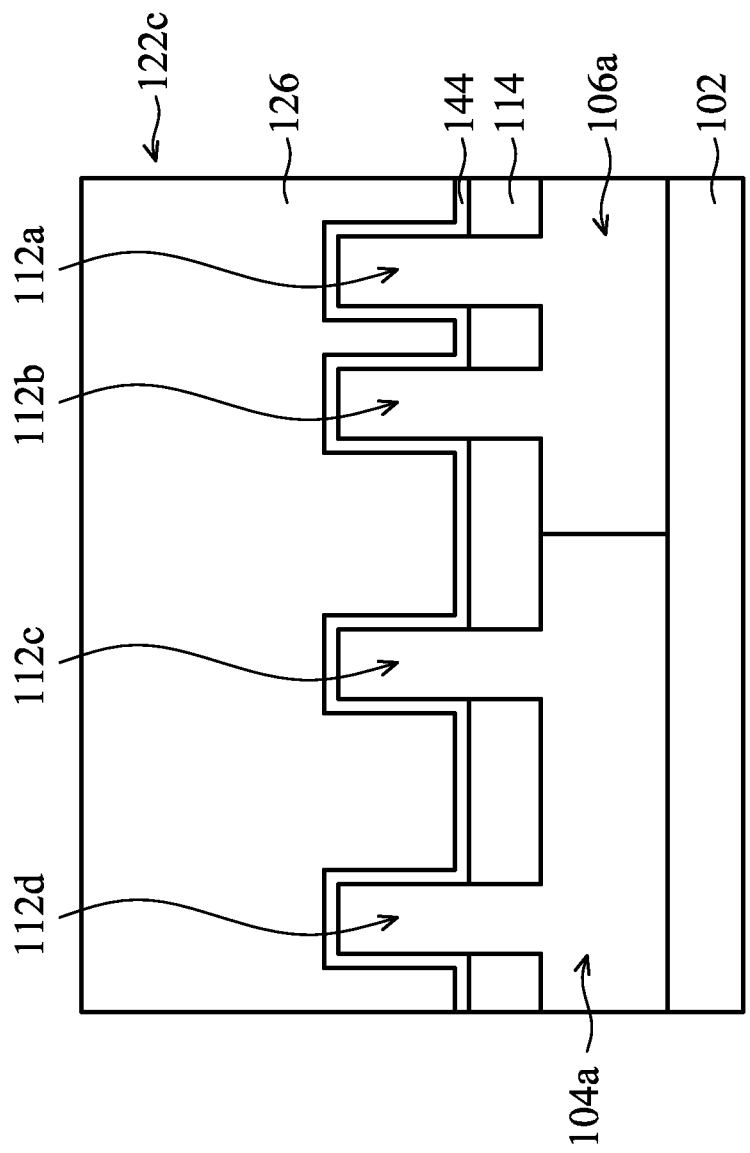
FIGS. 8A to 8E illustrate cross-sectional representations of various stages of manufacturing the semiconductor structure shown along line B-BB in FIG. 4 in accordance with some embodiments.

As show in FIGS. 6A and 8A, a substrate 102 includes a first-type well region 104a and a second-type well region 106a, and FIG. 7A is shown at the interface of the first-type well region 104a and the second-type well 106a (i.e. line A-AA shown in FIG. 4) in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

The first-type well region 104a and the second-type well region 106a may be formed by doping different types of dopants in the substrate 102. In some embodiments, the first-type well region 104a is an N well region doped with N-type dopants, and the second-type well region 106a is a P well region doped with P-type dopants. In some embodiments, the first-type well region 104a includes Si, SiGe, SiGeB, Ge, InSb, GaSb, InGaSb, or the like, and the second-type well region 106a includes Si, SiP, SiC, SiPC, InP, GaAs, AlAs, InAs, InAlAs, InGaAs, or the like.

After the first-type well region 104a and the second-type well region 106a are formed, fin structures 112a to 112e are formed over the substrate, as shown in FIGS. 6A and 8A in accordance with some embodiments. More specifically, the fin structures 112a and 112b are formed over the second-type well region 106a, and the fin structures 112c, 112d, and 112e are formed over the first-type well region 106b in accordance with some embodiments. In addition, the fin structures 112c and 112e are aligned with but separated from each other, as shown in FIG. 6A in accordance with some embodiments.

The fin structures 112a to 112e may be formed by patterning the substrate 102. For example, the fin structures 112a and 112b may be formed by patterning the second-type well region 106a, and the fin structures 112c, 112d, and 112e may be formed by patterning the first-type well region 104a.

After the fin structures 112a to 112e are formed, an isolation structure 114 is formed over the substrate 102, and the fin structures 112a to 112e are surrounded by the isolation structure 114, as shown in FIGS. 6A, 7A, and 8A in accordance with some embodiments. The isolation structure 114 may be formed by depositing an insulating layer over the substrate 102 and recessing the insulating layer. In some embodiments, the isolation structure 114 is made of silicon oxide, silicon nitride, silicon oxynitride, fluoride-doped silicate glass (FSG), or other low-K dielectric materials.

Next, dummy gate stack lines 122a to 122d are formed across the fin structures 112a to 112e and extend onto the isolation structure 114, as shown in FIGS. 6A, 7A, and 8A in accordance with some embodiments. More specifically, the dummy gate stack lines 122a and 122b are formed across the fin structures 112a and 112b over the second-type well region 106a and across the fin structures 112e and 122d over the first-type well region 104a in accordance with some embodiments. In addition, the dummy gate stack lines 122c and 122d are formed across the fin structures 112a and 112b over the second-type well region 106a and across the fin structures 112c and 112d over the first-type well region 104a in accordance with some embodiments.

In some embodiments, the dummy gate stack lines 122a to 122d individually include a gate dielectric layer 124 and a gate electrode layer 126 formed over the gate dielectric layer 124. In some embodiments, the gate dielectric layer 124 is made of silicon oxide. In some embodiments, the gate electrode layer 126 is made of polysilicon.

Figure 6B:
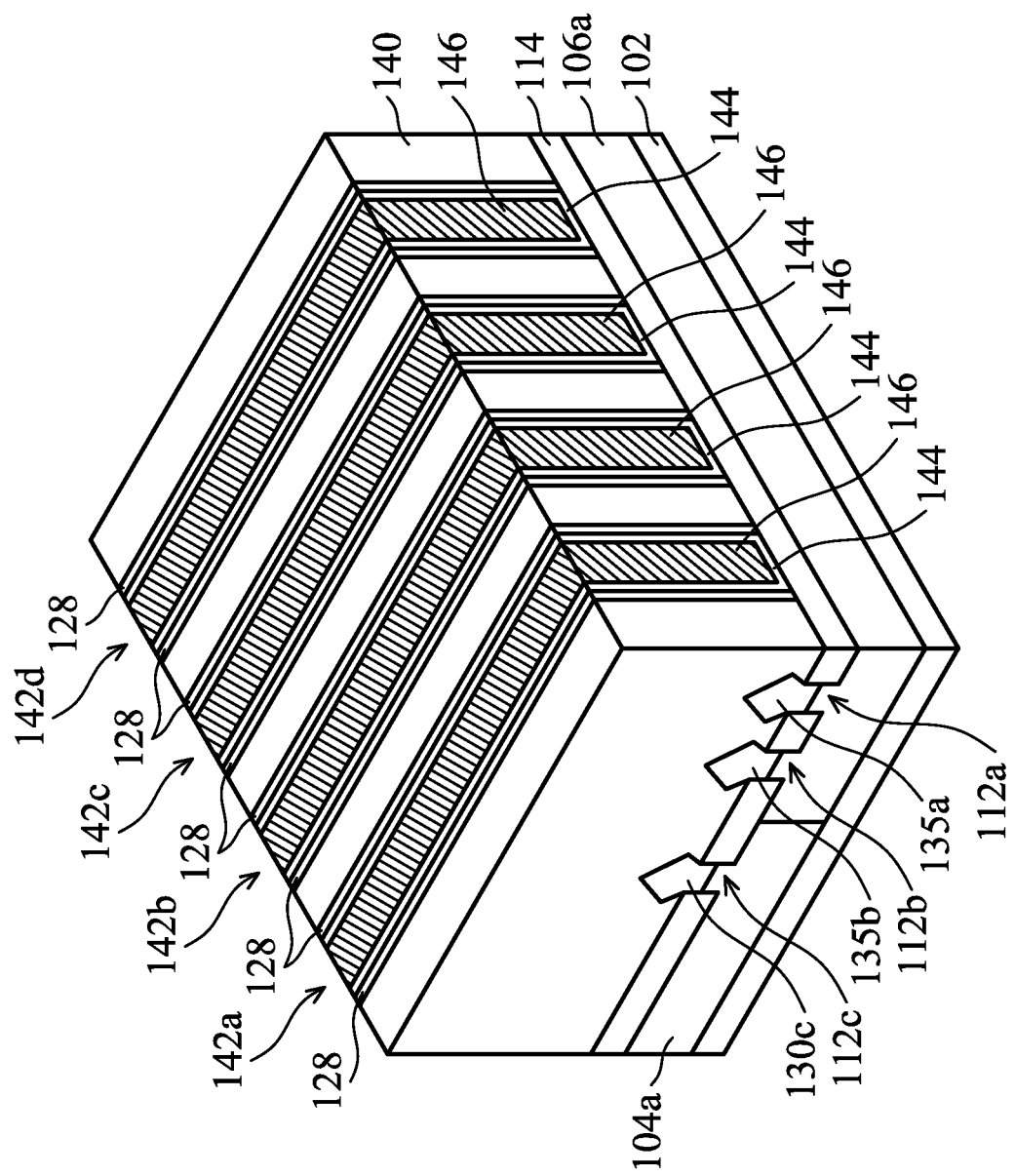
Figure 7B:
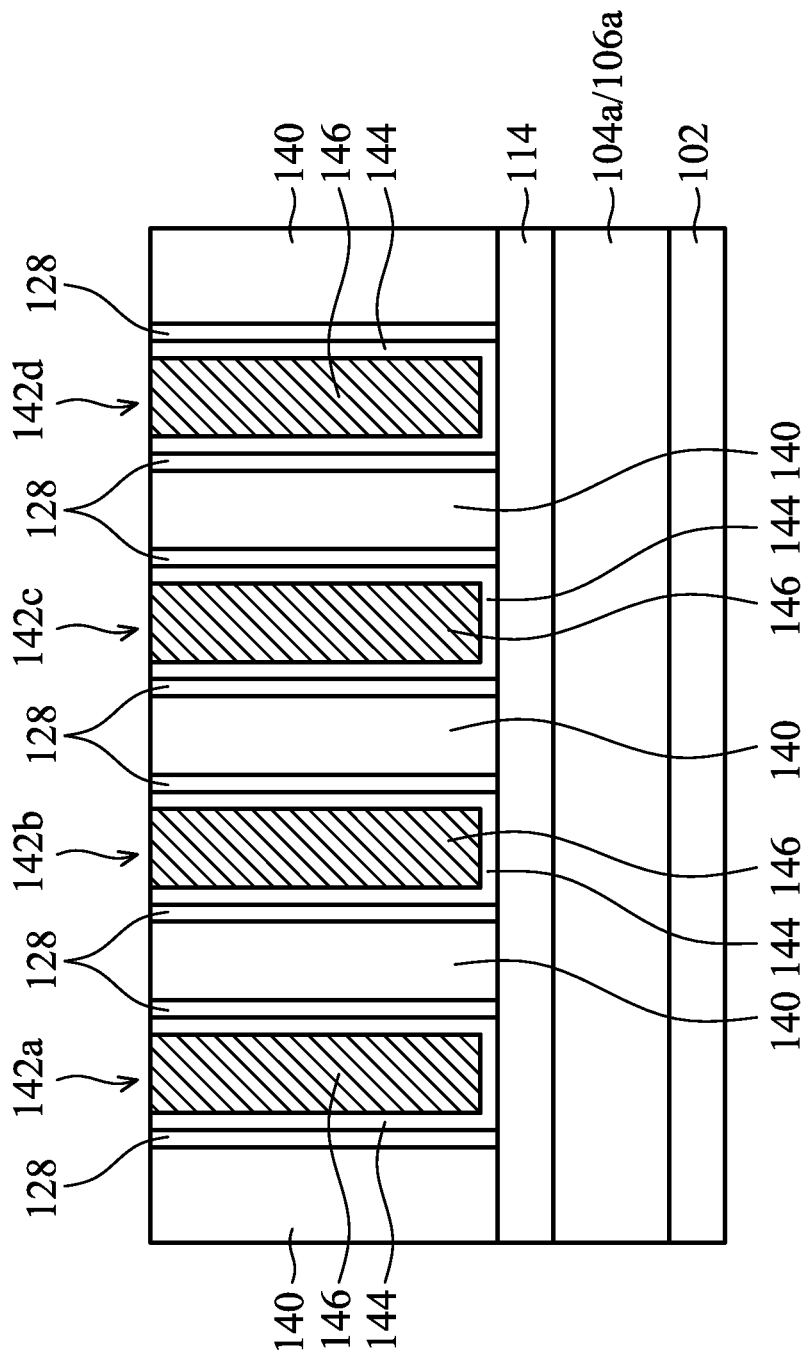

After the dummy gate stack lines 122a to 122d are formed, gate spacers 128 are formed on the sidewalls of the dummy gate stack lines 122a to 122d, as shown in FIGS. 6B and 7B in accordance with some embodiments. In some embodiments, the gate spacers 128 are made of silicon nitride, silicon oxide, silicon carbide, silicon oxynitride, or other applicable materials.

Next, source/drain structures are formed in the fin structures 112a to 112e adjacent to the dummy gate stack lines 122a to 122d, as shown in FIG. 6B in accordance with some embodiments. More specifically, source/drain structures 135a are formed in the fin structure 112a at opposite sides of the dummy gate stack lines 122a to 122d and source/drain structures 135b are formed in the fin structure 112b at opposite sides of the dummy gate stack lines 122a to 122d over the second-type well region 106a in accordance with some embodiments. In addition, source/drain structures 130c are formed in the fin structures 112c and 112e at opposite sides of the dummy gate stack lines 122a and 122d, and source/drain structures 130d (not shown in FIG. 6B; shown in FIG. 9) are formed in the fin structure 112d at opposite sides of the dummy gate stack lines 122b and 122c over the first-type well region 104a in accordance with some embodiments.

The source/drain structures 135a, 135b, 130c, and 130d may be formed by recessing the fin structures 112a to 112e and growing semiconductor materials in the recesses by performing epitaxial (epi) processes. The semiconductor materials may includes Si, SiP, SiC, SiPC, InP, GaAs, AlAs, InAs, InAlAs, InGaAs, SiGe, SiGeB, Ge, InSb, GaSb, InGaSb, or the like.

After the source/drain structures 135a, 135b, 130c, and 130d are formed, an interlayer dielectric (ILD) layer 140 is formed around the dummy gate stack lines 122a to 112d to cover the source/drain structures 135a, 135b, 130c, and 130d and the isolation structure 114, as shown in FIGS. 6B and 7B in accordance with some embodiments. The interlayer dielectric layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The interlayer dielectric layer 140 may be formed by chemical vapor deposition (CVD), physical vapor deposition, (PVD), atomic layer deposition (ALD), or other applicable processes.

Figure 8B:
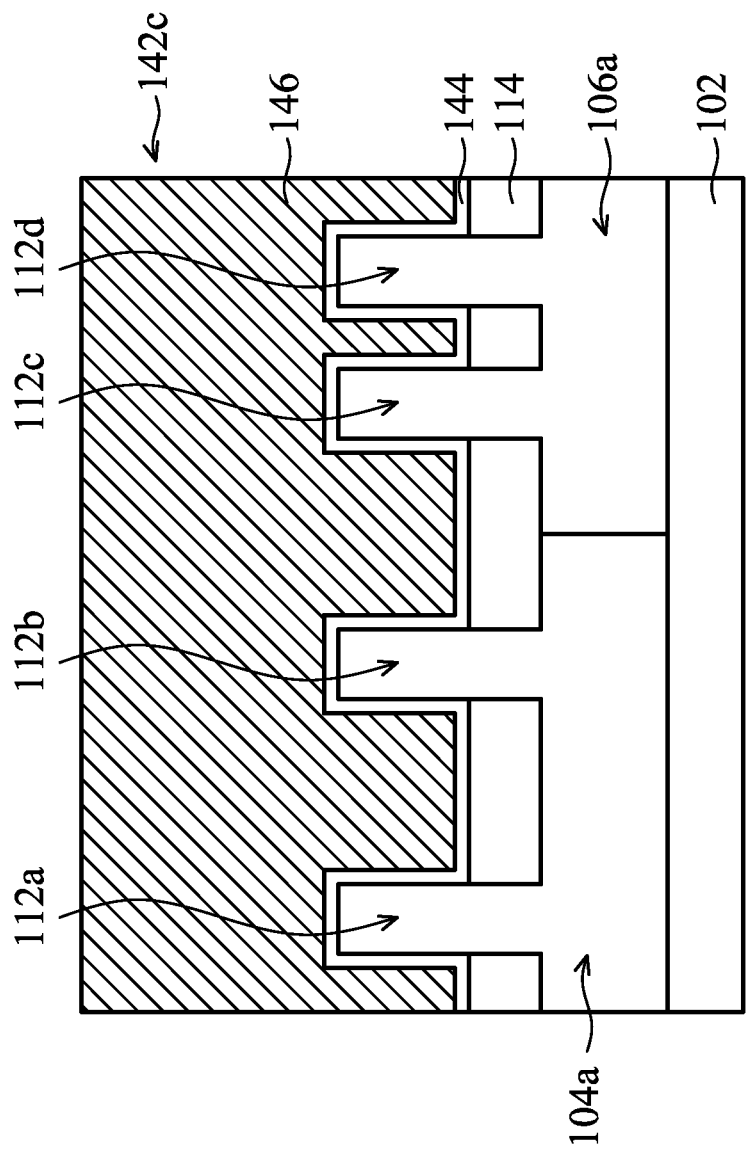

After the interlayer dielectric layer 140 is formed, the dummy gate stack lines 122a to 122d are replaced by gate stack lines 142a to 142d, as shown in FIGS. 6B, 7B and 8B in accordance with some embodiments. In some embodiments, the gate stack lines 142a to 142d individually include gate dielectric layers 144 and gate electrode layers 146.

In some embodiments, the gate dielectric layers 144 are made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, the gate electrode layers 146 are made of a conductive material, such as aluminum, copper, tungsten, titanium, tantalum, or other applicable materials. The gate stack lines 142a to 142d may further includes work functional layers (not shown) between the gate dielectric layers 144 and the gate electrodes layers 146 so the gate stack lines 142a to 142d may have the proper work function values.

Figure 6C:
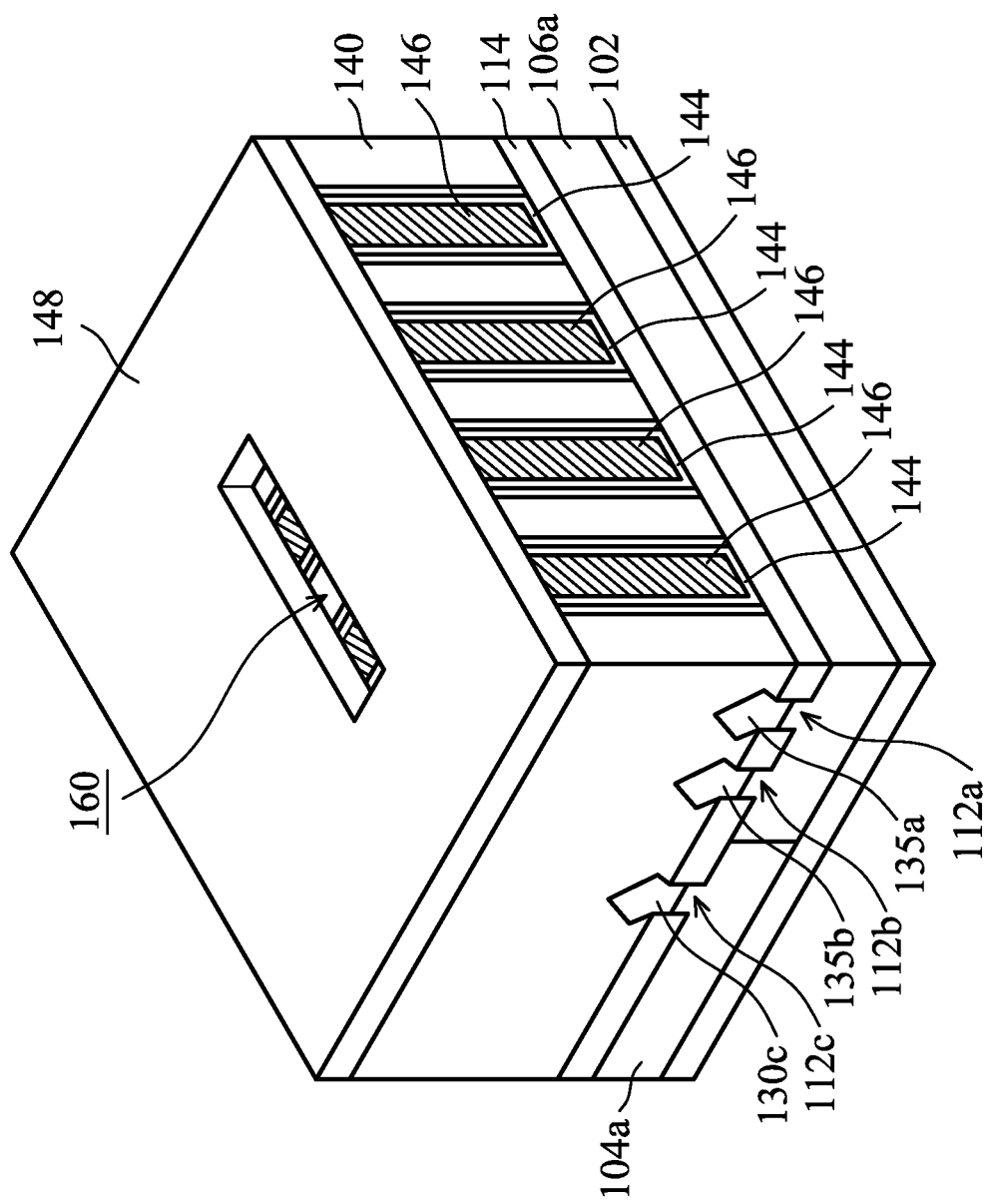
Figure 7C:
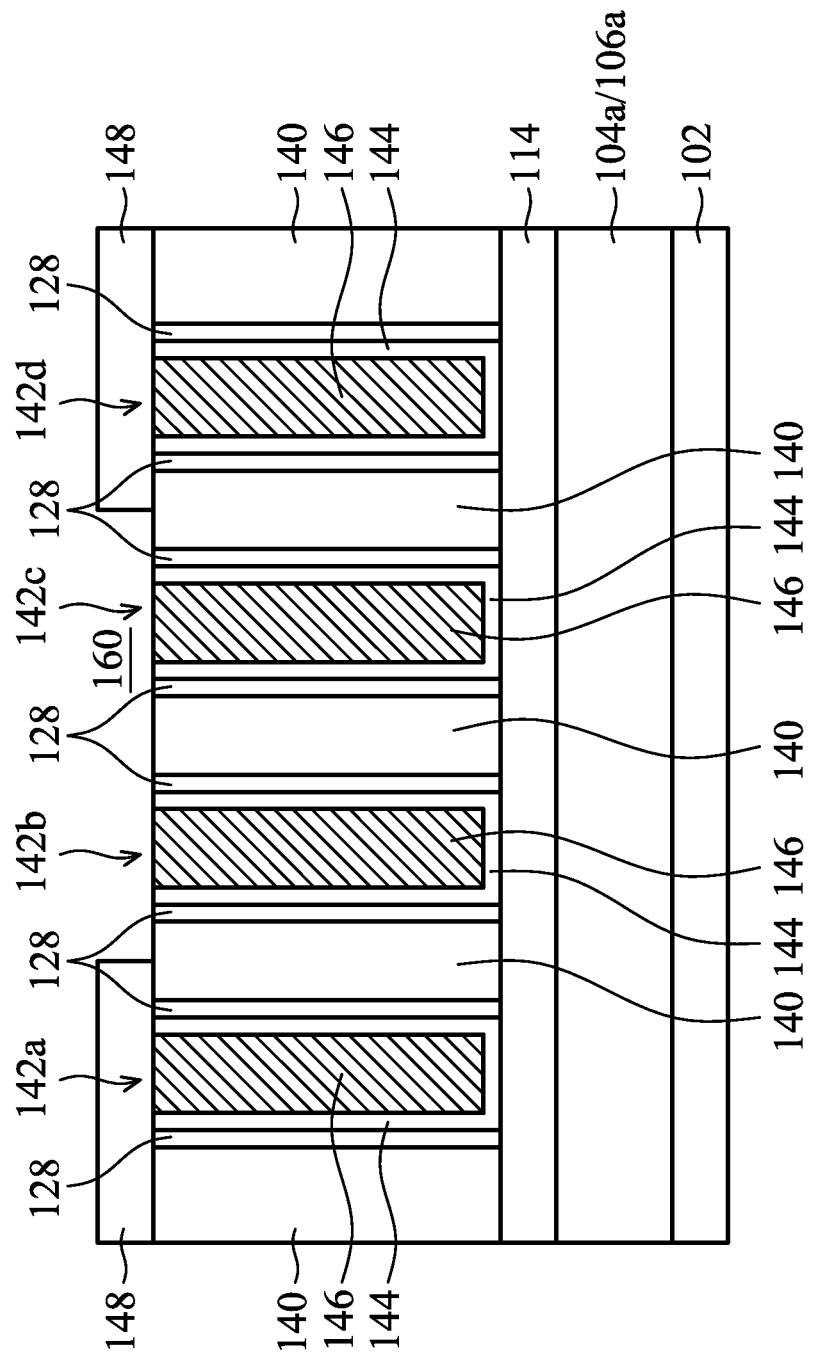
Figure 8C:
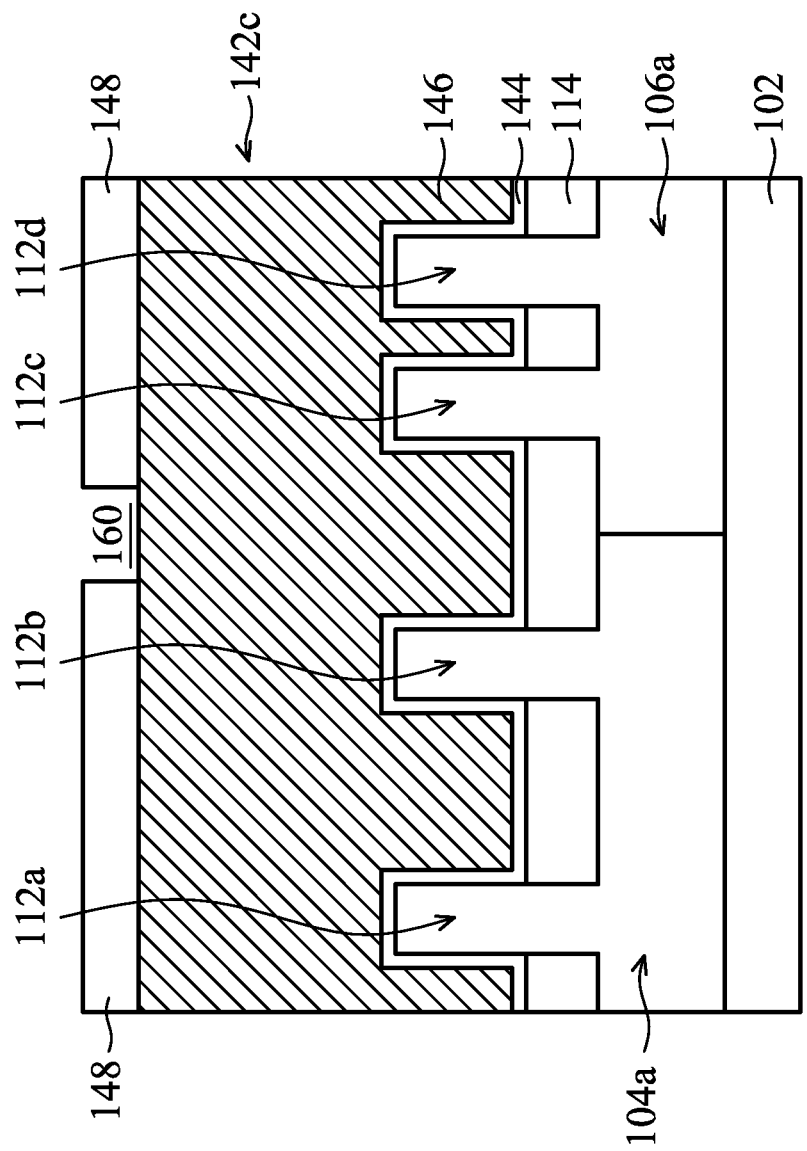

Next, a mask layer 148 is formed to cover the gate stack lines 142a to 142d and the interlayer dielectric layer 140, as shown in FIGS. 6C, 7C, and 8C in accordance with some embodiments. In addition, the mask layer 148 includes an opening 160 exposing the portions of the gate stack lines 142b and 142c that are designed to be cut (e.g. removed) in subsequent etching process in accordance with some embodiments. As shown in FIG. 7C, the opening 160 exposes some portions of the gate stack lines 142b and 142c and the gate spacers 128 and the portions of the interlayer dielectric layer 140 between and adjacent to the exposed portions of the gate stack lines 142b and 142c in accordance with some embodiments.

In some embodiments, the mask layer 148 is made of silicon nitride, silicon oxynitride, silicon oxide, titanium nitride, silicon carbide, one or more other applicable materials, or a combination thereof. The mask layer 148 may be formed by depositing a dielectric layer using a spin-on process, a CVD process, a PVD process, or other applicable processes and patterning the dielectric layer through an opening in a photoresist layer (not shown) formed over the dielectric layer.

Figure 6D:
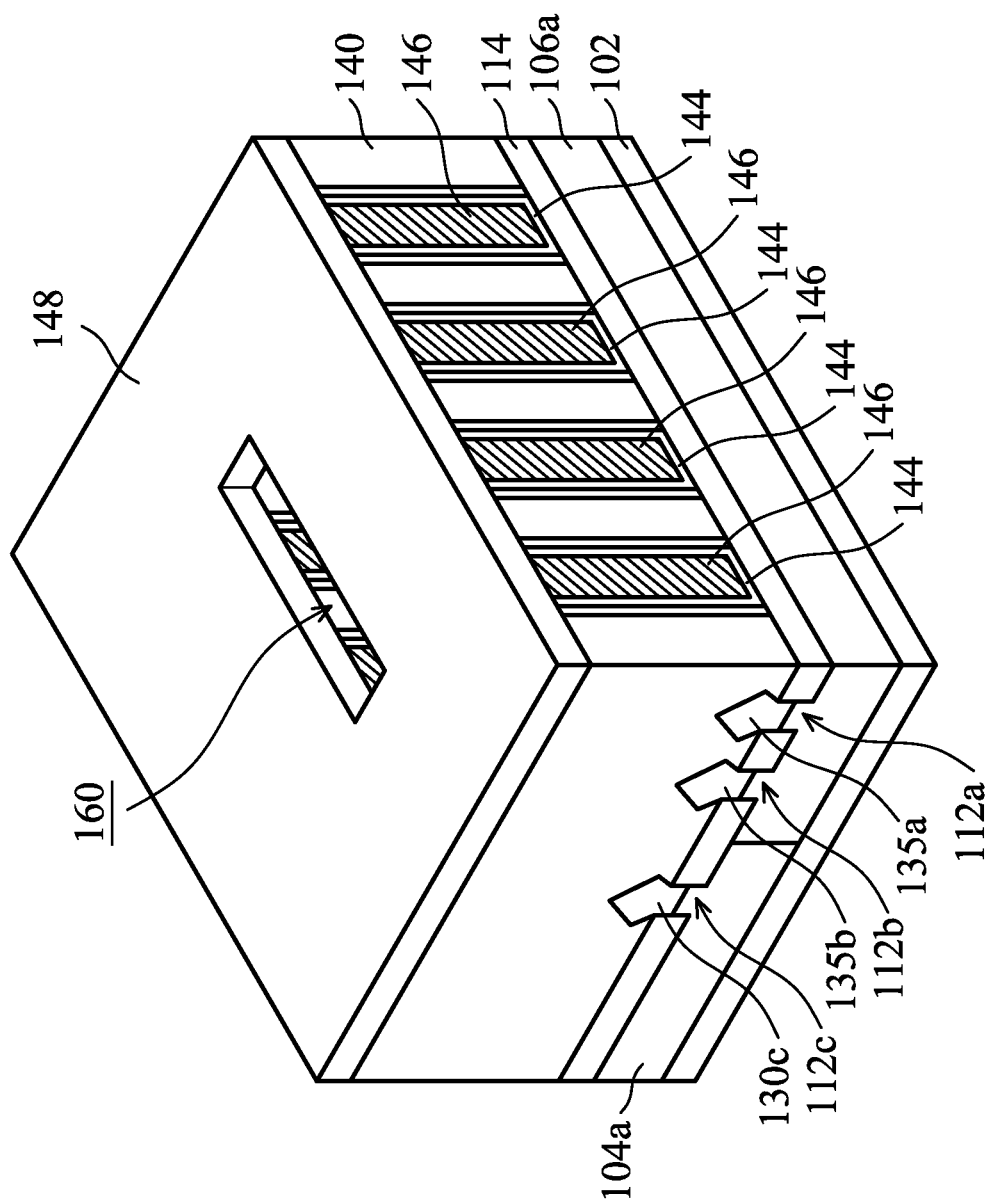
Figure 7D:
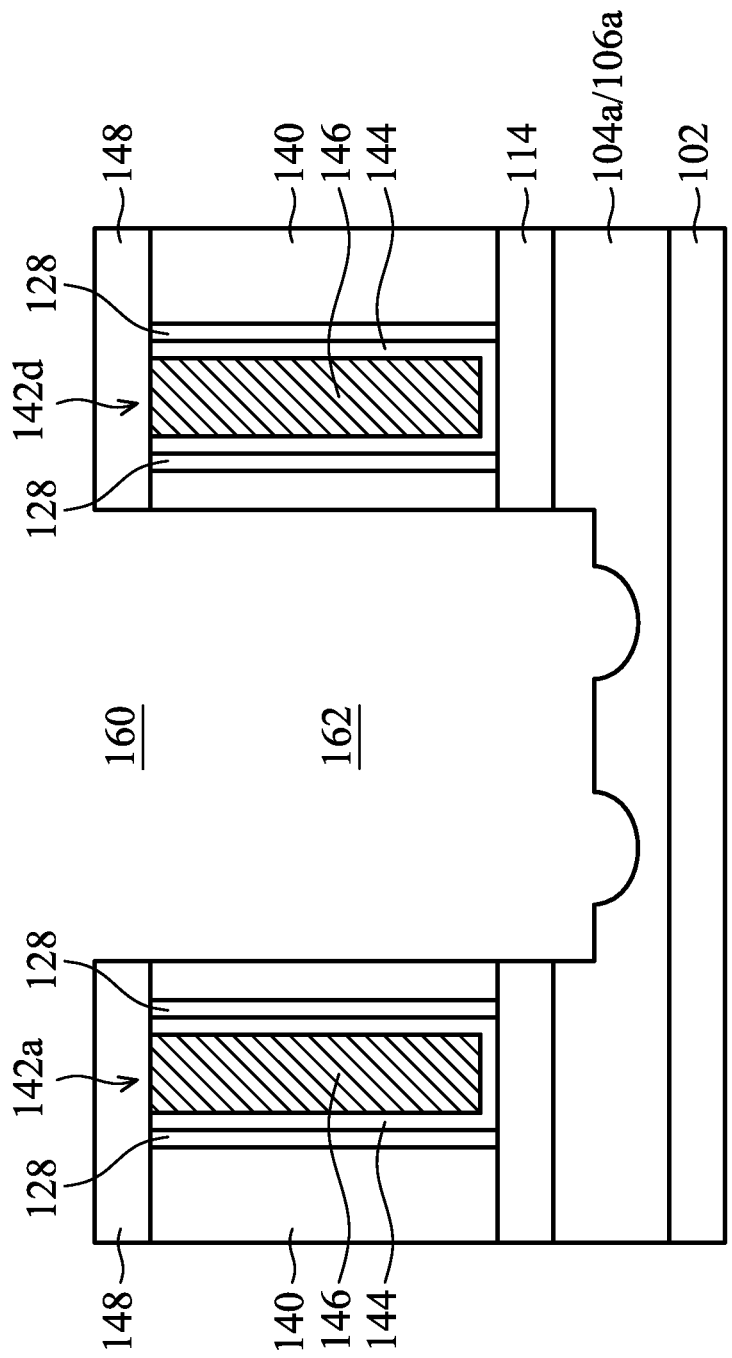
Figure 8D:
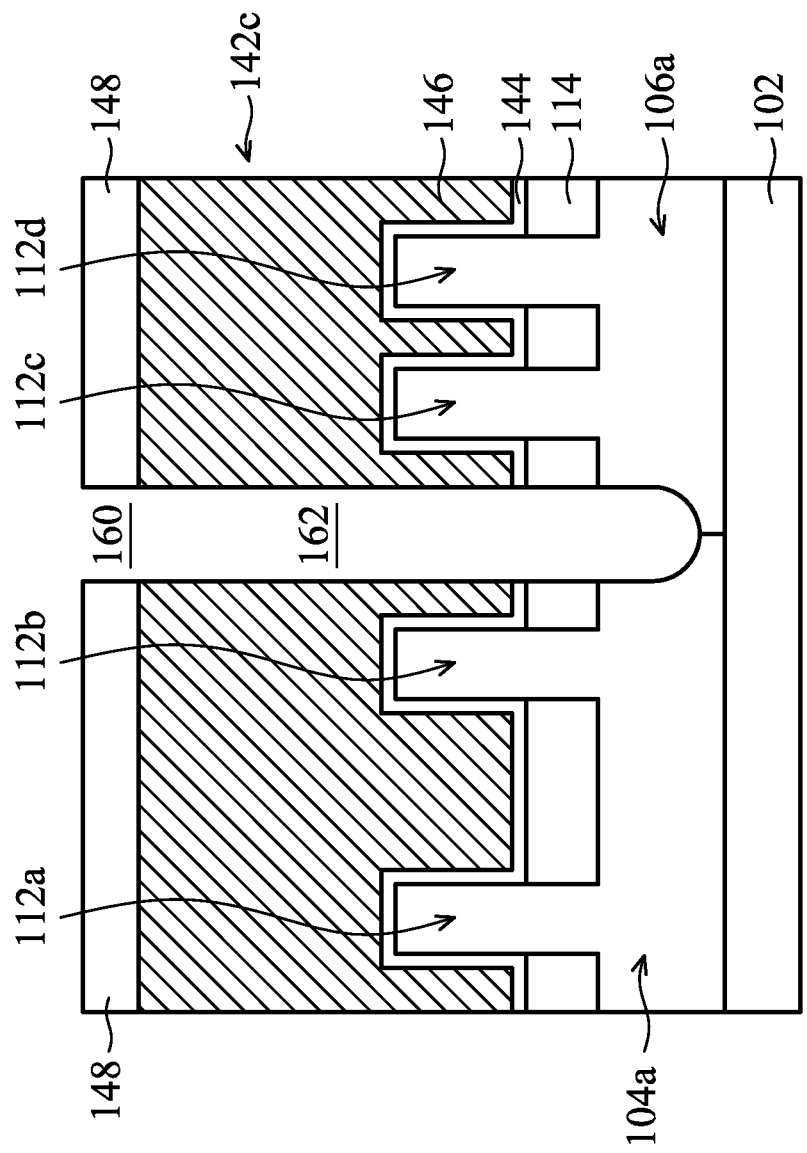

After the mask layer 148 is formed, the exposed portions of the gate stack lines 142b and 142c and the exposed portions of the interlayer dielectric layer 140 are etched through the opening 160 of the mask layer 148 to form a recess 162, as shown in FIGS. 6D, 7D, and 8D in accordance with some embodiments.

In some embodiments, the portions of the gate stack lines 142b and 142c, the gate spacers 128, and the interlayer dielectric layer 140 exposed by the opening 160 of the mask layer 148 are etched in an etching process. In addition, an etchant (e.g. an etching gas) used in the etching process may have a higher etching rate to the materials in the gate stack lines 142b and 142c than that to the gate spacers 128 and the interlayer dielectric layer 140. Therefore, although the sidewalls of the opening 160 in the mask layer are substantially straight, the sidewalls of the resulting recess 162 may not be straight due to the differences of the etching rate of different materials (details will be described and shown later.)

In addition, the portions of the isolation structure 114 and the upper portions of the first-type well region 104a and the second-type well region 106a under the opening 160 are also etched, so that the recess 162 further extends through the isolation structure 114 and extends into the first-type well region 104a and the second-type well region 106a, as shown in FIGS. 7D and 8D in accordance with some embodiments. In some embodiments, the recess 162 is formed over the interface of the first-type well region 104a and the second-type well region 106a, and the interface of the first-type well region 104a and the second-type well region 106a is exposed by the recess 162.

Furthermore, since the etching process for forming the recess 162 has a greater etching rate toward the gate stack lines 142b and 142c than that toward the gate spacers 128 and the interlayer dielectric layer 140, the bottoms of the recess 162 originally under the gate stack lines 142b and 142c are lower than the bottoms of the recess 162 originally under the gate spacers 128 and the interlayer dielectric layer 140, as shown in FIG. 7D in accordance with some embodiments. However, although the portions of the recess 162 originally under the gate stack lines 142b and 142c are relatively deep, the recess 162 does not penetrate the first-type well region 104a and the second-type well region 106a. That is, the bottommost of the recess 162 is higher than the bottom surfaces of the first-type well region 104a and the second-type well region 106a in accordance with some embodiments.

After the recess 162 is formed, a pre-treating process is performed on the sidewalls and the bottom surfaces of the recess 162 in accordance with some embodiments. The pre-treating process may be configured to passivate Si—H dangling bond and $Si/SiO_2$ interface trap. In some embodiments, the pre-treating process includes applying a plasma of a treating gas onto the sidewalls and the bottom surfaces of the recess 162, and the treating gas includes $O_2$, $H_2$, $N_2H_2$, or the like. The hydrogen atom in the treating gas may passivate the defects inside or on the surface of Si atoms without producing additional electrons. In some embodiments, the pre-treating process includes applying F-containing gas, P-containing gas, or O-containing gas to interstitially or substitutionally insert into Si lattice, so that the depletion charge on Si surfaces could be altered or more SiO2 would to form to reduce depletion effect.

Figure 6E:
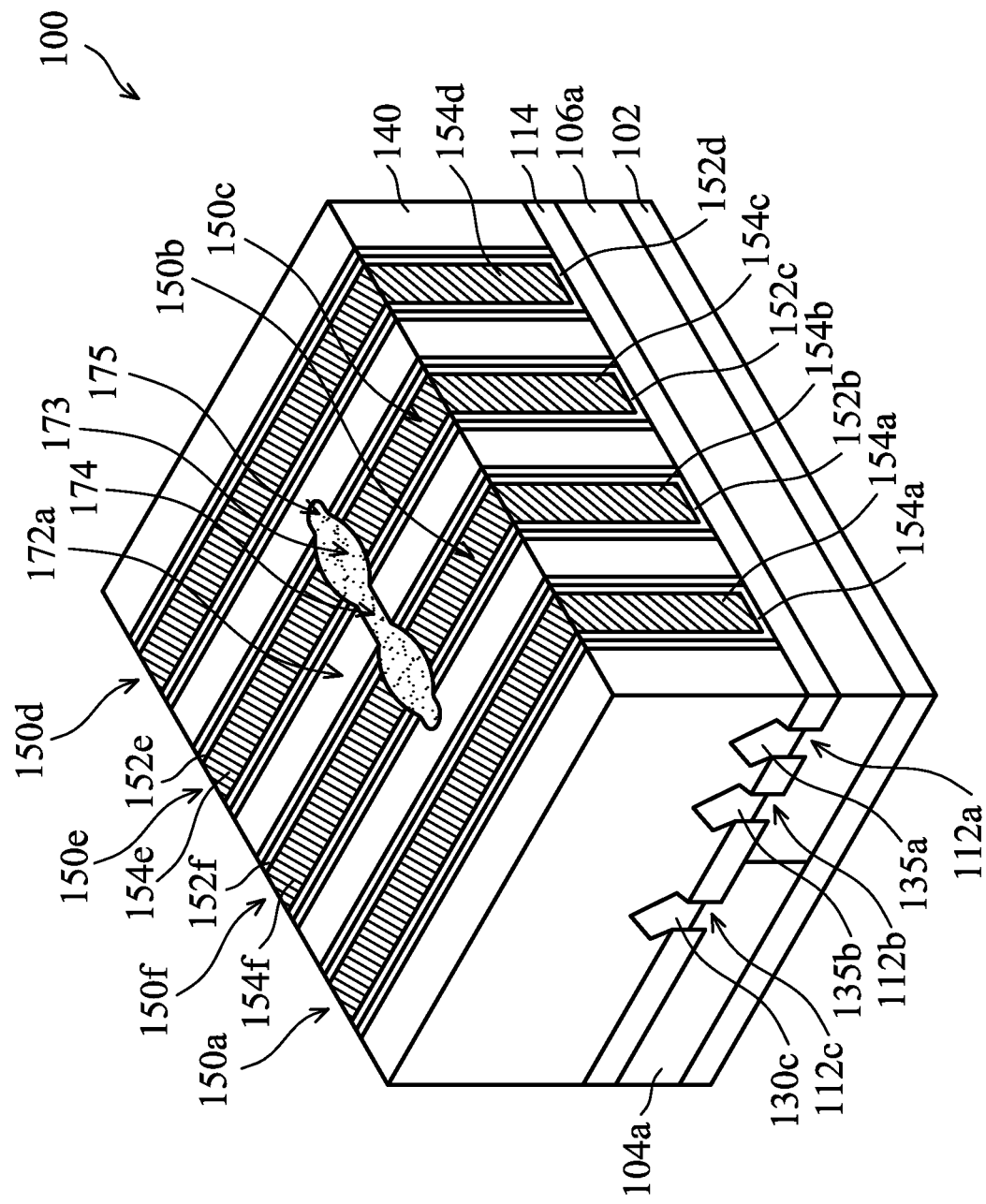
Figure 7E:
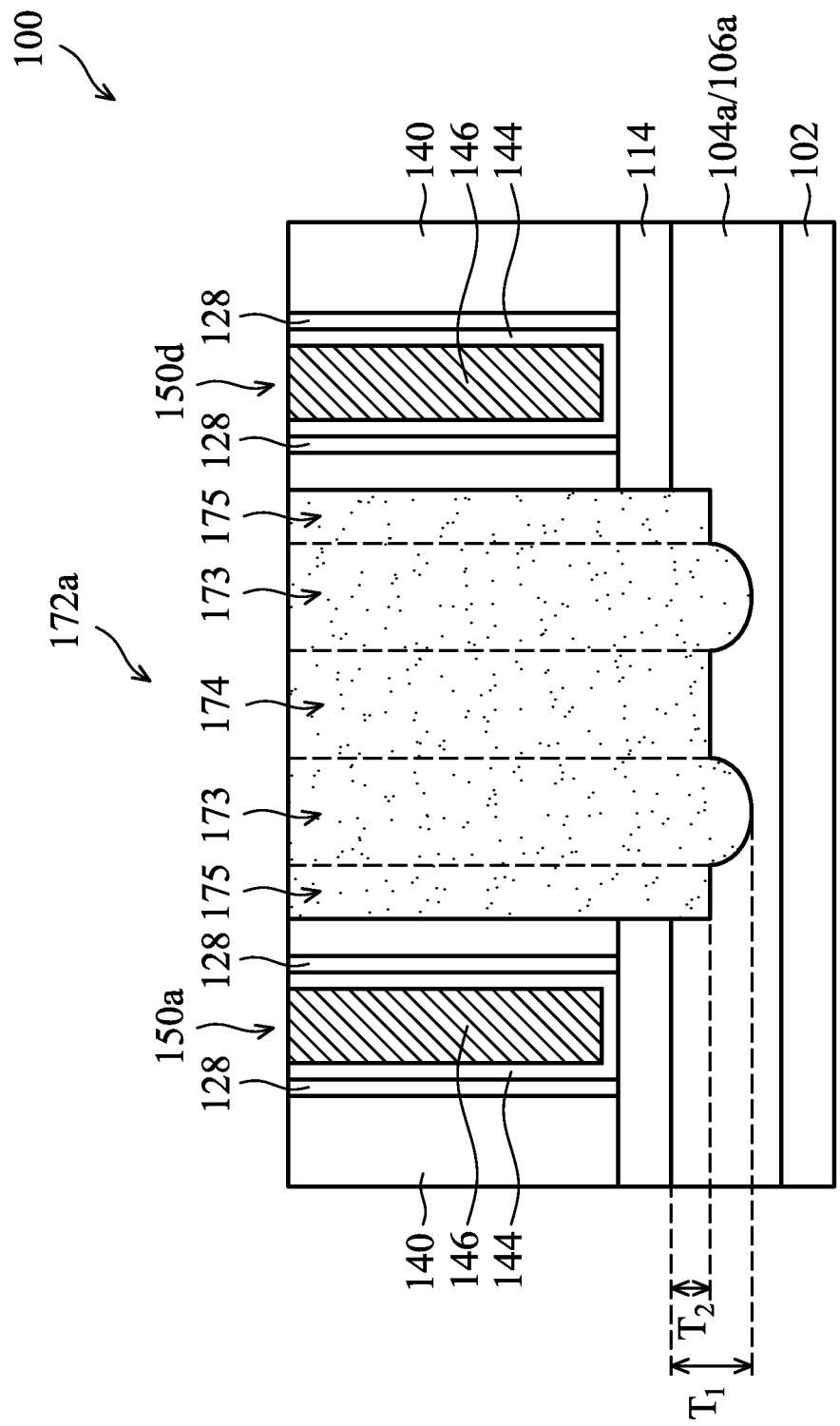
Figure 8E:
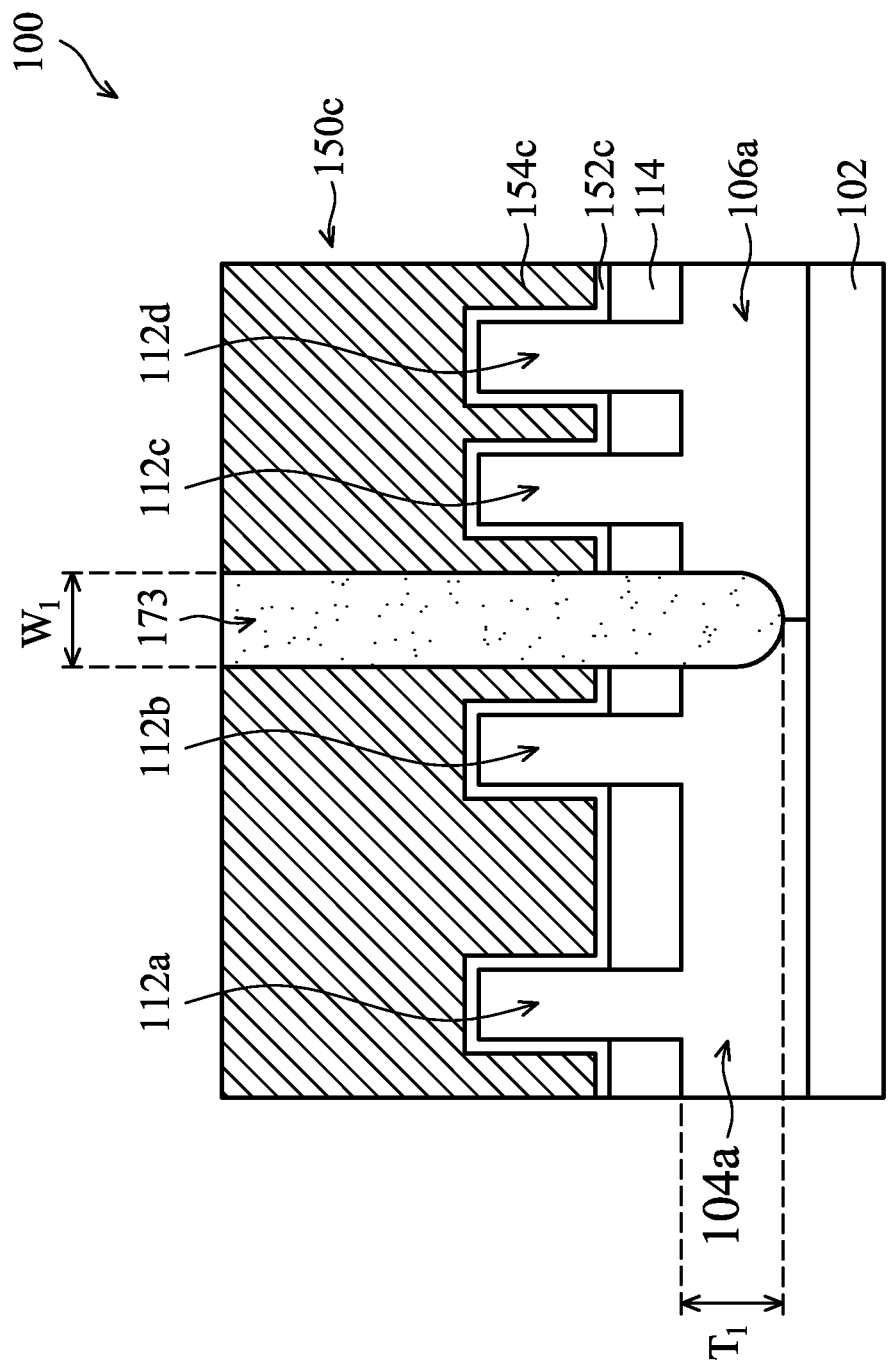

Afterwards, a dielectric structure 172a is formed in the recess 162, and the mask layer 148 is removed to form a semiconductor structure 100, as shown in FIGS. 6E, 7E, and 8E in accordance with some embodiments. As shown in FIG. 6E, the dielectric structure 172a penetrates the gate stack lines 142b and 142c and extends into the interlayer dielectric layer 140 at opposite sides of the gate stack lines 142b and 142c in accordance with some embodiments. In some embodiments, a ratio of the length L of the dielectric structure 172a to a pitch P of the gate stack lines 142b and 142c is in a range of about 2.5 to about 3. The pitch P may be defined as the distance between the center of the gate stack line 142b and the center of the gate stack line 142c.

As shown in FIG. 4, dielectric structures (e.g. the dielectric structures 172a and 172b) may be formed to separate the gate stack lines 142a to 142d into various gate structures, although FIGS. 6E, 7E, and 8E only show the dielectric structure 172a. More specifically, the gate stack line 142b is cut to form gate structures 150b and 150f separated by the dielectric structure 172a and the gate stack line 142c is cut to form gate structures 150c and 150e separated by the dielectric structure 172a, as shown in FIG. 6E in accordance with some embodiments. In addition, the gate stack lines 142a and 142d are also cut (not shown in FIG. 6E; shown in FIG. 4) to form the gate structures 150a and 150d in accordance with some embodiments.

In some embodiments, the gate structures 150a, 150b, 150c, 150d, 150e, and 150f respectively includes gate dielectric layers 152a, 152b, 152c, 152d, 152e, and 152f (i.e. the gate dielectric layer 144) and gate electrode layers 154a, 154b, 154c, 154d, 154e, and 154f (i.e. the gate electrode layer 146).

In some embodiments, the dielectric structure 172a is formed by depositing a dielectric material to fill in the recess 162, and polishing the dielectric material until the top surface of the interlayer dielectric layer 140 is exposed. The dielectric material for forming the dielectric structure 172a may be chosen according to its applications to change the junction profile in the substrate 102 and to reduce the current leakage in the substrate 102. In some embodiments, the dielectric structure 172a is made of a nitrogen-containing material, such as SiN, SiOCN, and SiON, to induce a positively-charged depleted region. In some embodiments, the dielectric structure 172a is made of an oxygen-containing material, such as $SiO_2$, to induce a neutral depleted region. In some embodiments, the dielectric structure 172a is made of an oxygen-containing material, such as $SiO_x$ (x is a positive integral), to induce a negatively-charged depleted region. In some implementations, when the dielectric structure 172a is to induce a negatively-charged depleted region, the dielectric structure 172a is implanted or plasma treated.

In some embodiments, after the dielectric material is formed in the recess 162, a plasma treatment is performed. In some embodiments, the plasma treatment includes applying dopants into the dielectric material. In some embodiments, the dopants includes fluorine, boron, nitrogen, phosphor, or the like. The plasma treatment may be configured to modify the properties of the dielectric structure 172a, so that the junction profile in the substrate 102 may be adjusted accordingly.

As shown in FIGS. 6E and 7E, the dielectric structure 172a includes first portions 173 located between the gate structures 150b and 150f and between the gate structures 150c and 150e and a second portion 174 and third portions 175 at opposite sides of the first portions 173 in accordance with some embodiments.

Figure 9:
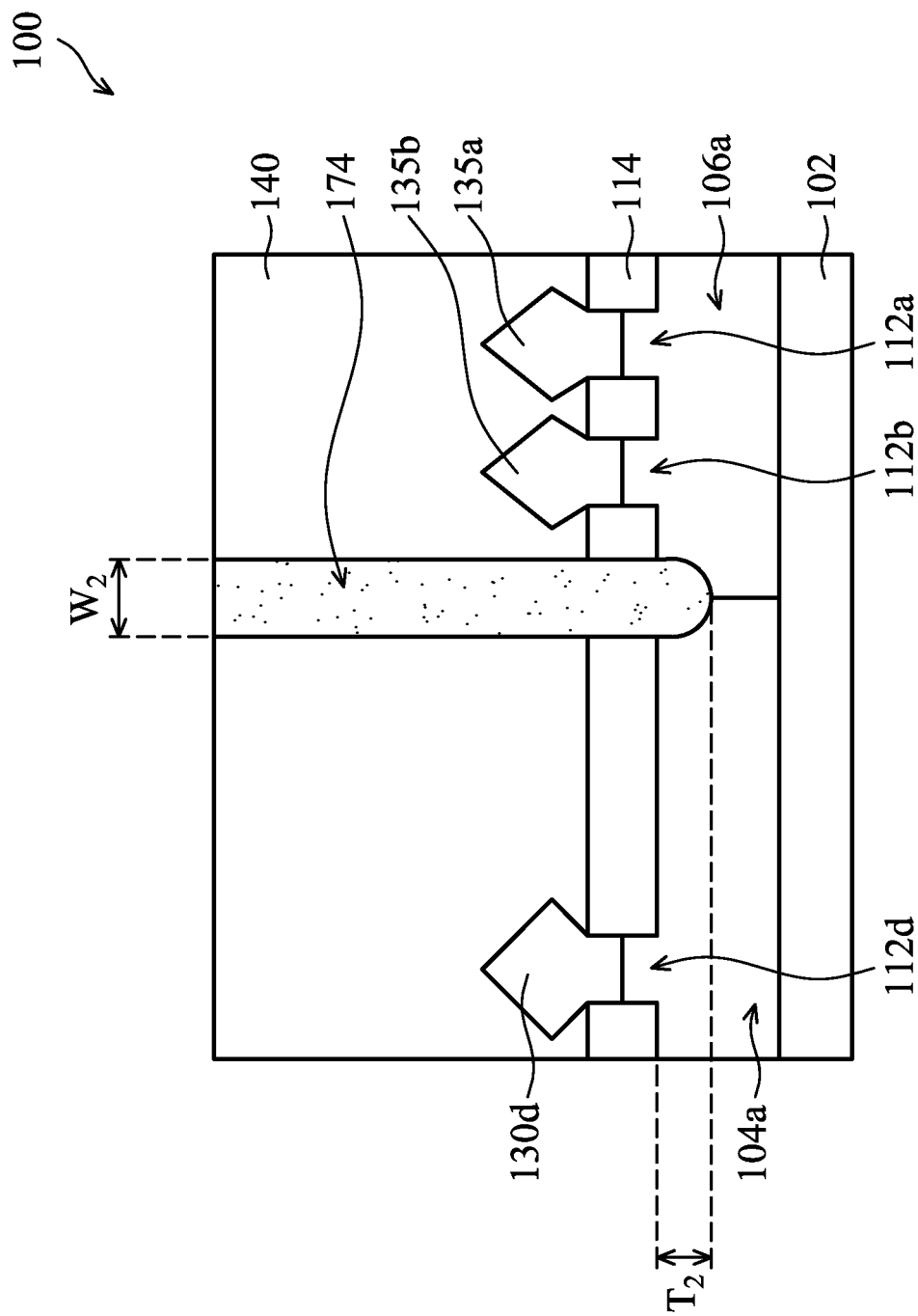
FIG. 9 is a cross-sectional representation of the semiconductor structure shown in FIG. 6E and shown in FIG. 4 along line C-C in accordance with some embodiments.

FIG. 9 is a cross-sectional representation of the semiconductor structure 100 shown in FIG. 6E and shown in FIG. 4 along line C-CC in accordance with some embodiments. In some embodiments, the width $W_1$ of the first portion 173 is greater than the width $W_2$ of the second portion 174 due to the differences in etching rates towards different materials when forming the recess 162. In addition, the bottom surfaces of the first portions 173, the second portions 174, and the third portion 175 of the dielectric structure 172a are not flat in accordance with some embodiments.

As described previously, the recess 162 may penetrate the interlayer dielectric layer 140 and the isolation structure 114 and extend into the first-type well region 104a and the second-type well region 106a. Therefore, the second portion 174 of the dielectric structure 172a is located between two portions of the interlayer dielectric layer 140 and the isolation structures 114 and has an extending portion below the isolation structure 114 and directly over the interface of the first-type well region 104a and the second-type well region 106a, as shown in FIG. 9 in accordance with some embodiments. The extending portion may induce a depleted charge region in the substrate 102, so that the electrical charges in the substrate 102 would be affected by the extending portion 173.

In some embodiments, the thickness $T_2$ of the extending portion of the second portion 174 of the dielectric structure 172a is in a range from about 10 nm to about 70 nm. The extending portion of the second portion 174 should be thick enough, so the current leakage in the semiconductor structure 100 may be reduced. On the other hand, the extending portion of the second portion 174 may not be too thick, or the first portion 173 may penetrate the first-type well region 104a and the second-type well region 106a.

In some embodiments, the first portion 173 of the dielectric structure 172a has an extending portion extending into the first-type well region 104a and the second-type well region 106a and the thickness $T_1$ of the first portion 173 is greater than the thickness $T_2$ of the second portion 174. However, the first portion 173 of the dielectric structure 172a does not penetrate the first-type well region 104a and the second-type well region 106a. In some embodiments, the thickness $T_1$ of the extending portion of the first portion 173 of the dielectric structure 172a is in a range from about 30 nm to about 100 nm. The extending portions of the first portions 173 and the second portion 174 may be defined as the portions lower than the bottom of the isolation structure 114, and the thicknesses may be measured from the level of the bottom of the isolation structure 114 to the bottommost of the extending portions.

In some embodiments, the ratio of the thickness $T_1$ to the thickness $T_2$ is in a range from about 2 to about 5. The ratio described above may be related to the difference of the etching rates in different regions. Therefore, the ratio should not be too low or too much lateral etching may occur when forming the recess 162. On the other hand, the ratio should not be too high or the performance of the semiconductor structure may be undermined due to charge effect under high plasma bombardment.

Figure 10A:
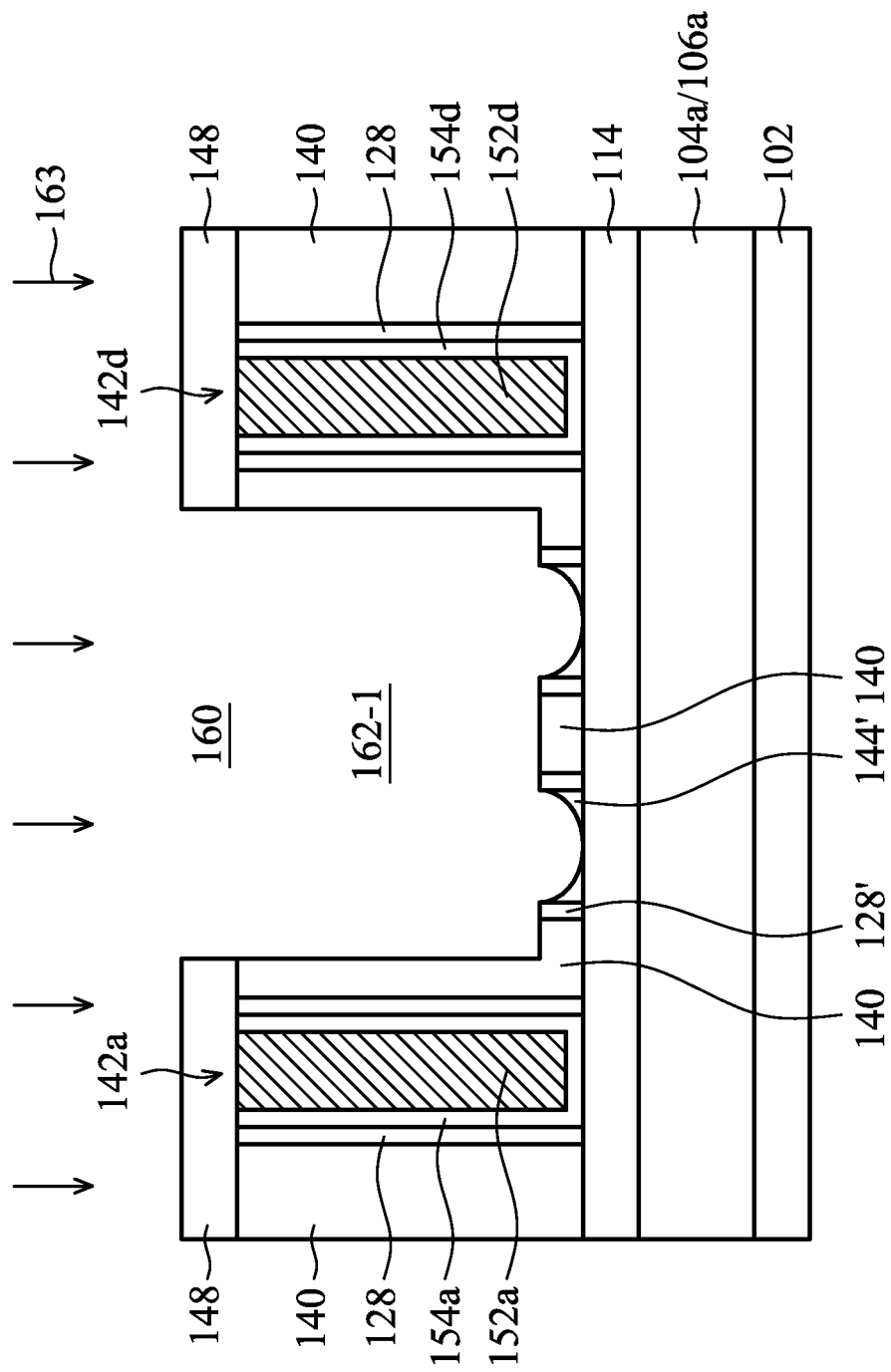
FIGS. 10A to 10C illustrate cross-sectional representations of forming a semiconductor structure in accordance with some embodiments.
Figure 10B:
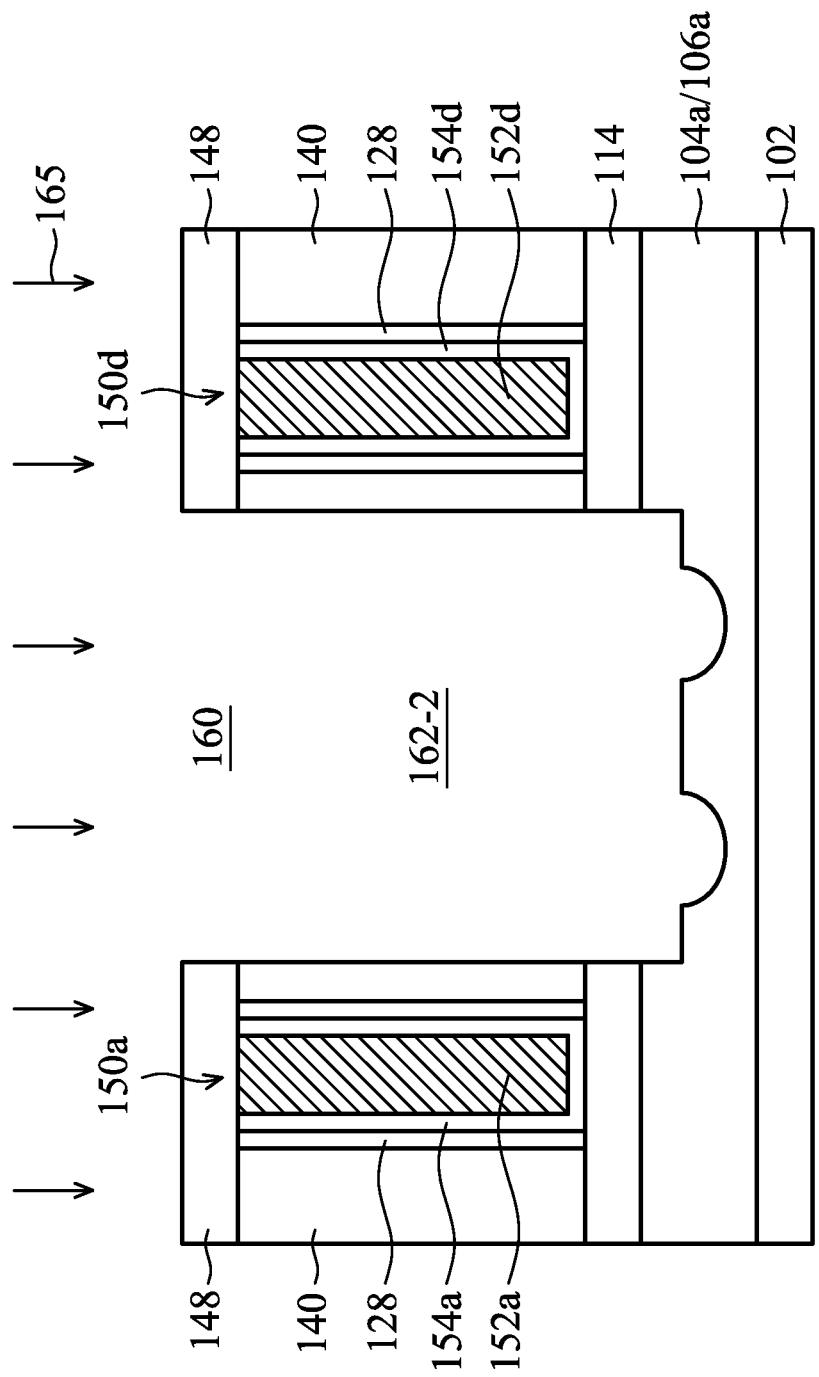
Figure 10C:
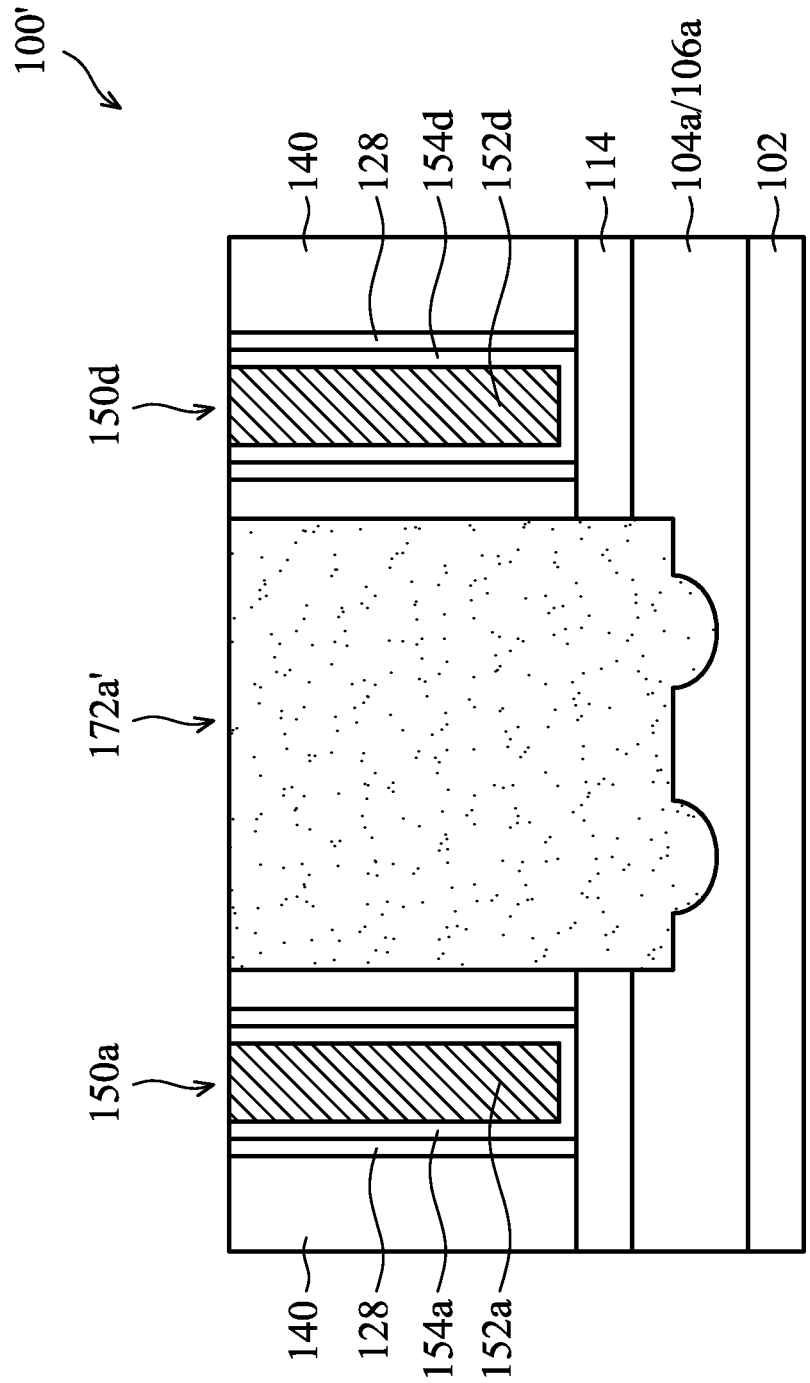

FIGS. 10A to 10C illustrate cross-sectional representations of forming a semiconductor structure 100' in accordance with some embodiments. Processes and materials for forming the semiconductor structure 100' may be similar to, or the same as, those for forming the semiconductor structure 100 described above, except the recess for cutting the gate stack lines are formed by performing two etching processes.

More specifically, processes shown in FIGS. 7A to 7C are performed, and a first recess 162-1 is formed by performing a first etching process 163 through the opening 160 of the mask layer 148 as shown in FIG. 10A and a second recess 162-2 is formed by performing a second etching process 165 through the first recess 162-1 as shown in FIG. 10B in accordance with some embodiments.

During the first etching process 163, the gate stack lines, the gate spacers, and the interlayer dielectric layer exposed by the opening 160 of the mask layer 148 are etched until the top surface of the isolation structure 114 is exposed, as shown in FIG. 10A in accordance with some embodiments. In addition, some portions of the gate spacers 128', gate dielectric layers 144', and gate electrode layers (not shown) under the opening 160 still remain in the first recess 162-1 in accordance with some embodiments.

After the first etching process 163 is performed, the second etching process 165 is performed to completely remove the gate spacers 128', gate dielectric layers 144', and gate electrode layers 146' under the opening 160, as shown in FIG. 10B in accordance with some embodiments. In addition, the isolation structure 114, the first-type well region 104a, and the second-type well region 106a are etched through the first recess 162-1 to form the second recess 162-2 extending through the isolation structure 114 and into the upper portion of the first-type well region 104a and the second-type well region 106a in accordance with some embodiments.

In some embodiments, the etchant used in the first etching process 163 are different from the etchants used in the second etching process 165. In some embodiments, an etchant (e.g. an etching gas) used in first etching process 163 has a relatively high etching rate to the materials in the gate stack lines 142b and 142c, while an etchant (e.g. an etching gas) used in second etching process 165 has a relatively high etching rate to the materials (e.g. $SiO_2$ and Si) of the isolation structure 114 and the substrate 102 (including the first-type well region 104a and the second-type well region 106a).

After the second recess 162-2 is formed, a dielectric structure 172a' is formed in the second recess 162-2, as shown in FIG. 10C in accordance with some embodiments. The processes and materials for forming the dielectric structure 172a' may be similar to, or the same as, those for forming the dielectric structure 172a shown in FIG. 7E and therefore are not repeated herein.

Figure 11A:
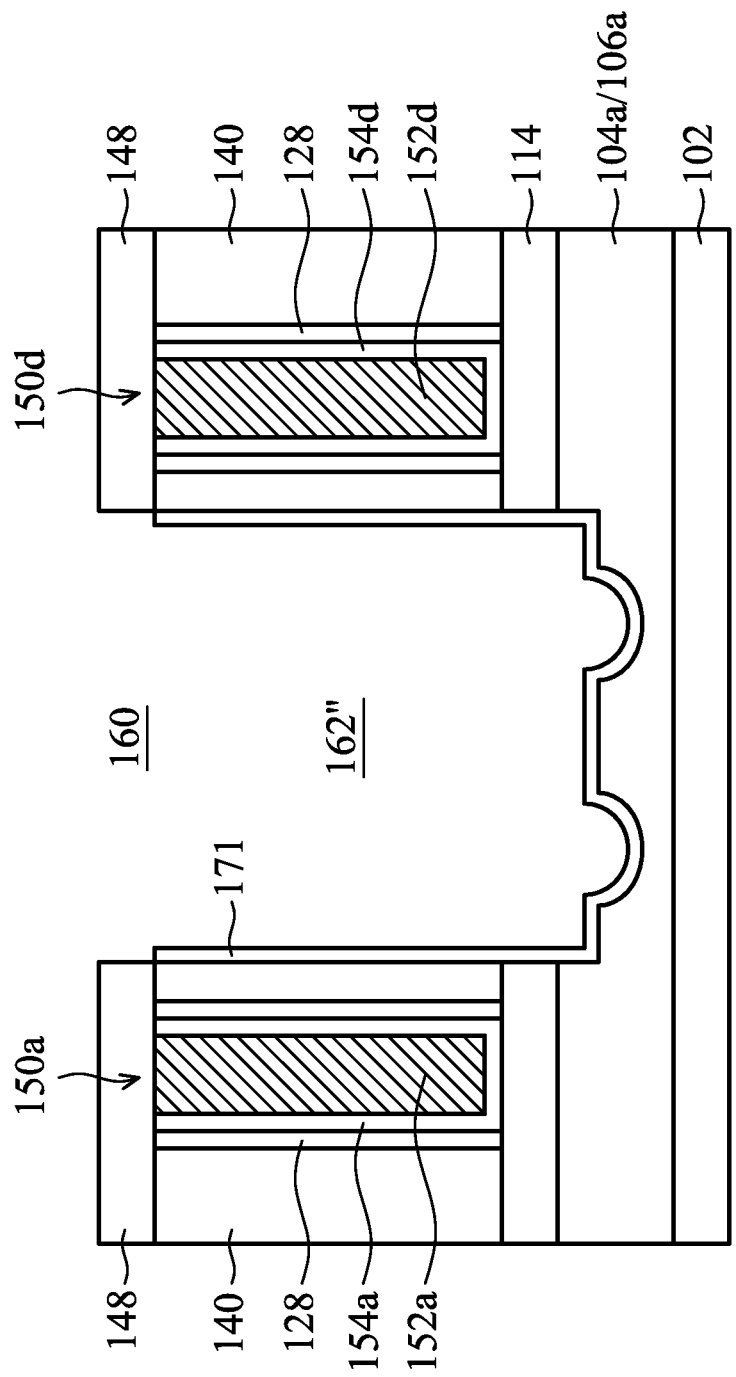
FIGS. 11A and 11B illustrate cross-sectional representations of forming a semiconductor structure in accordance with some embodiments.
Figure 11B:
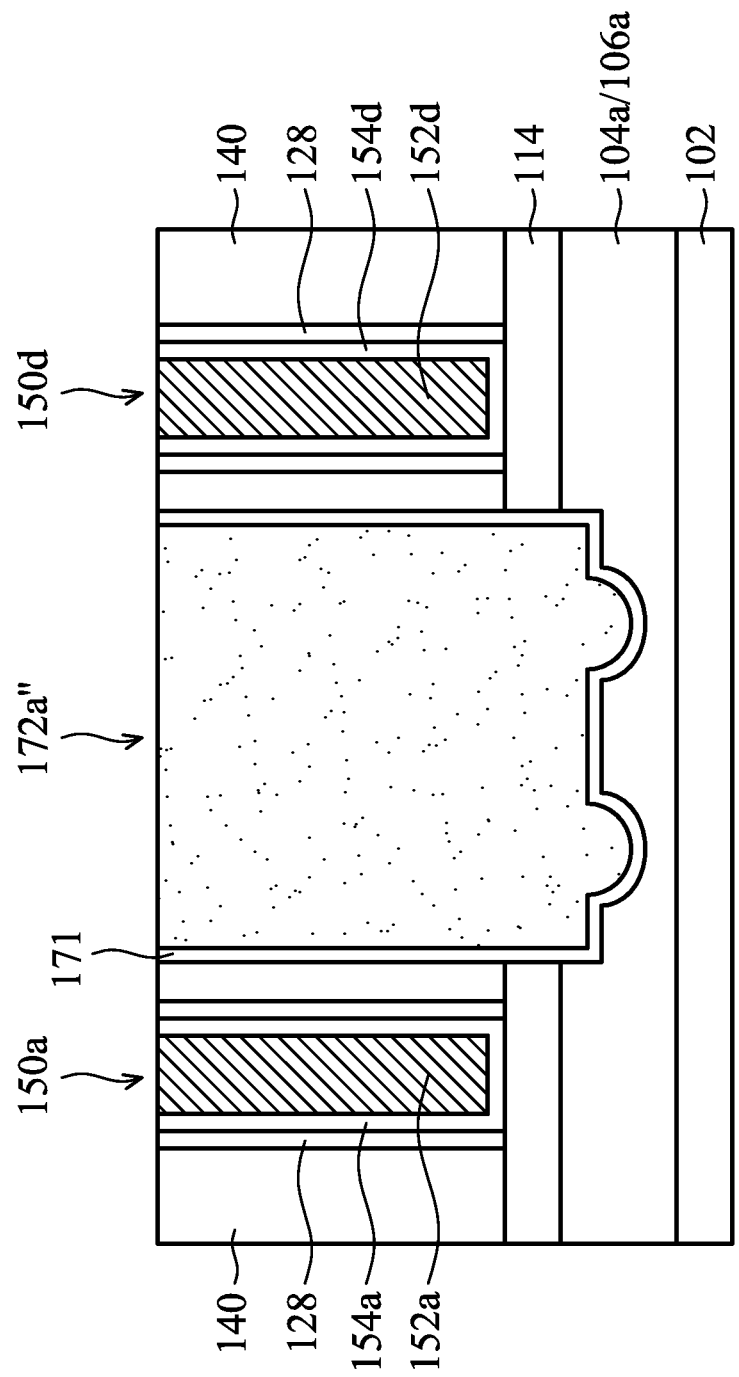

FIGS. 11A and 11B illustrate cross-sectional representations of forming a semiconductor structure 100'' in accordance with some embodiments. Processes and materials for forming the semiconductor structure 100'' may be similar to, or the same as, those for forming the semiconductor structures 100 and 100' described above, except a native oxide layer is formed when etching the gate stack lines, the gate spacers, and the interlayer dielectric layer.

More specifically, processes shown in FIGS. 7A to 7D or FIGS. 10A and 10B are performed to form a recess 162'', and a native oxide layer 171 is formed, as shown in FIG. 11A in accordance with some embodiments. The native oxide layer may be formed due to the etchants used in the etching process for forming the recess 162''. In some embodiments, the native oxide layer is formed on the sidewalls and the bottom surfaces of the recess 162''. In some embodiments, the thickness of the native oxide layer 171 is in a range of about 1 nm to about 3 nm.

Next, a dielectric structure 172a'' is formed in the second recess 162'', as shown in FIG. 11B in accordance with some embodiments. The processes and materials for forming the dielectric structure 172a'' may be similar to, or the same as, those for forming the dielectric structure 172a shown in FIG. 7E and therefore are not repeated herein.

Figure 12:
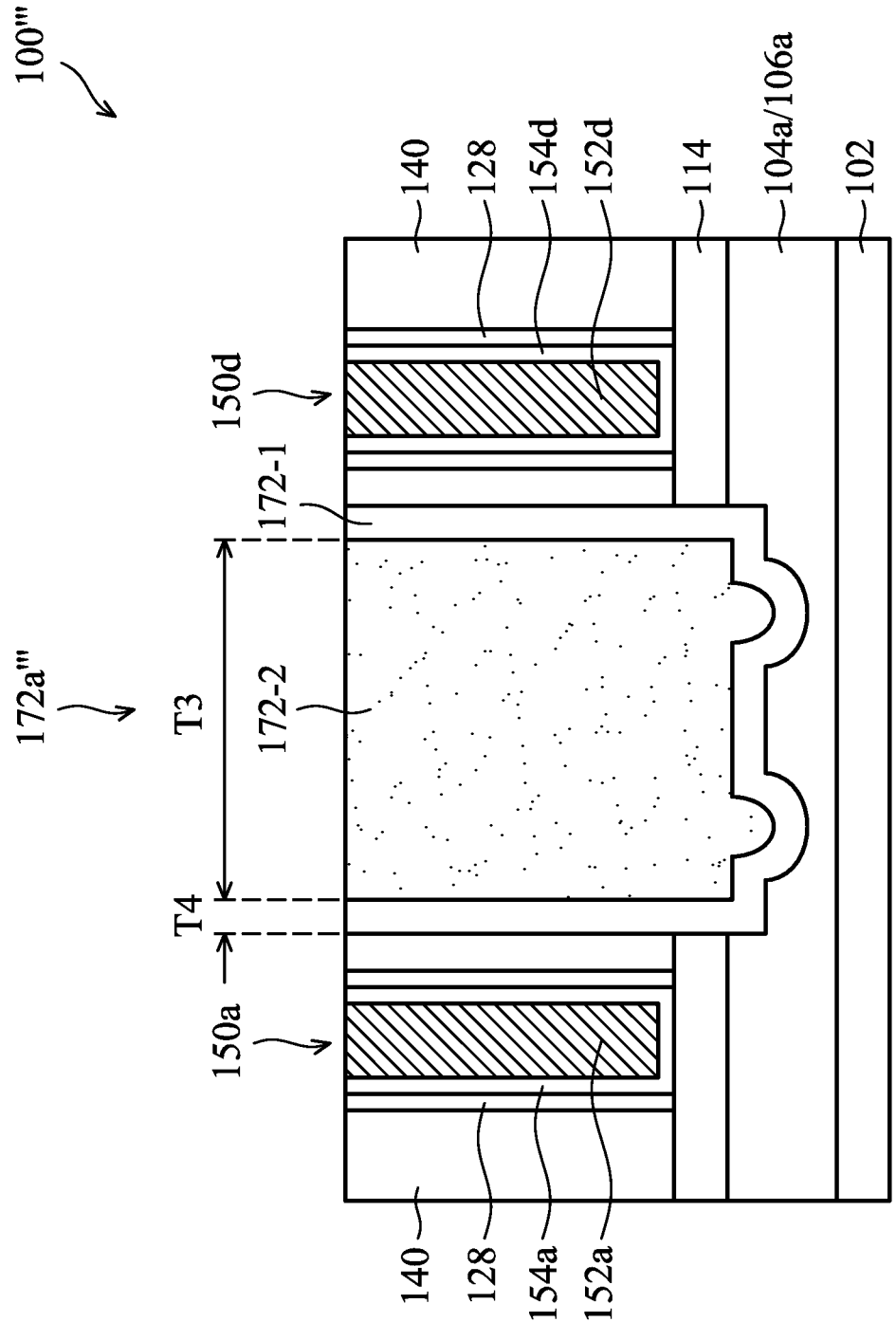
FIG. 12 illustrates a cross-sectional representation of a semiconductor structure in accordance with some embodiments.

FIG. 12 illustrates a cross-sectional representation of a semiconductor structure 100''' in accordance with some embodiments. Processes and materials for forming the semiconductor structure 100''' may be similar to, or the same as, those for forming the semiconductor structures 100 and 100' described above, except two dielectric materials are deposited in the recess to form a dielectric structure 172a'''.

More specifically, processes shown in FIGS. 7A to 7D, 10A, and 10B may be performed to form a recess, and a first dielectric material layer 172a-1 is conformally deposited on the sidewalls and the bottom surface of the recess and a second dielectric material layer 172a-2 is deposited over the first dielectric material layer 172a-1 to form a dielectric structure 172a''', as shown in FIG. 12 in accordance with some embodiments.

As described previously, the junction profile may be changed by adjusting the material of the dielectric structure. Accordingly, in some embodiments, the dielectric structure 172a''' includes the first dielectric material layer 172a-1 and the second dielectric material layer 172a-2 that are made of different dielectric materials. In some embodiments, the first dielectric material layer 172a-1 is made of an oxygen-containing material (e.g. silicon oxide) and the second dielectric material layer 172a-2 are made of a nitrogen-containing material (e.g. silicon nitride).

Furthermore, the depleted charge region induced by the dielectric structure 172''' may be controlled by adjusting the thickness of the first dielectric material layer 172a-1 and the second dielectric material layer 172a-2. In some embodiments, the thickness $T_3$ of the second dielectric material layer 172a-2 is greater than the thickness $T_4$ of the first dielectric material layer 172a-1, so that the current leakage from P+ to P well region may be reduced, as shown in FIG. 12.

Figure 13:
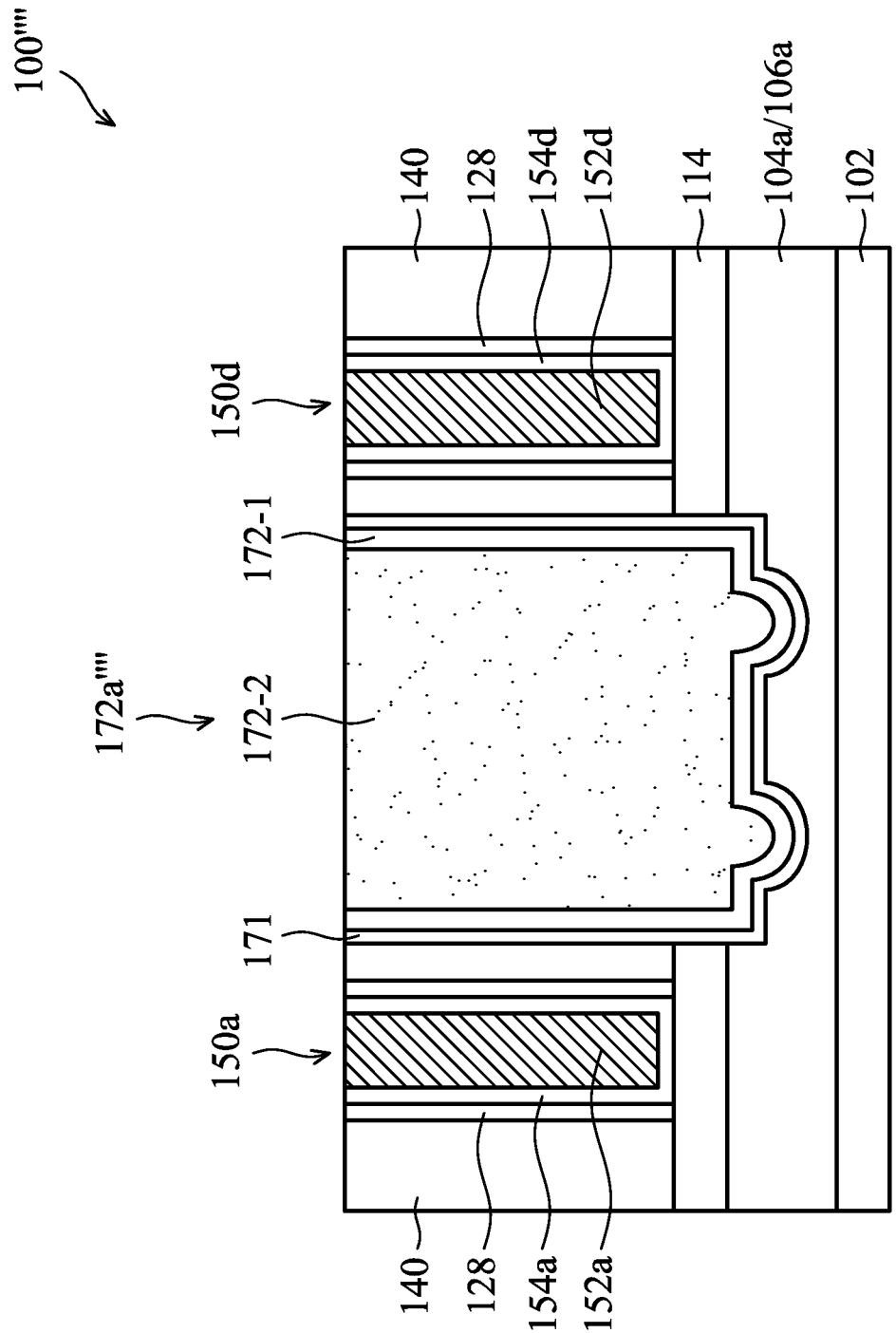
FIG. 13 illustrates a cross-sectional representation of a semiconductor structure in accordance with some embodiments.

FIG. 13 illustrates a cross-sectional representation of a semiconductor structure 100'''' in accordance with some embodiments. Processes and materials for forming the semiconductor structure 100'''' may be similar to, or the same as, those for forming the semiconductor structures 100''' described above, except the native oxide layer 171 is formed under the first dielectric material layer 172a-1 and the second dielectric material layer 172a-2.

More specifically, processes shown in FIG. 11A are performed to form a recess, and the first dielectric material layer 172a-1 is deposited over the native oxide layer 171 and the second dielectric material layer 172a-2 is deposited over the first dielectric material layer 172a-1 to form a semiconductor structure 100'''', as shown in FIG. 13 in accordance with some embodiments. In some embodiments, the first dielectric material layer 172a-1, the second dielectric material layer 172a-2, and the native oxide layer 171 are made of different dielectric materials.

As described above, the junction profile in the substrate 102 may be adjust by forming the dielectric structures (e.g. dielectric structure 172a, 172a', 172a'', 172a''', and 172a''''). In some embodiments, the junction profile may be changed by adjusting the thickness of the extending portions of the dielectric structure below the isolation structure 114. In some embodiments, the junction profile may be changed by performing a pre-treating process to the recess (e.g. the recess 162) before depositing the material for forming the dielectric structures. In some embodiments, the junction profile may be changed by adjusting/changing the material for forming the dielectric structures (e.g. the dielectric structure 172a) and using multiple dielectric materials to form the dielectric structures (e.g. the dielectric structure 172a'', 172a''', and 172a'''').

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments for SRAM structures are provided. PMOS transistors formed in an N-type well region and the NMOS transistors formed in a P-type well region are separated by an isolation region (e.g., STI). A dielectric structure is formed at a boundary (or a junction, interface) between the P-type and N-type well regions. The dielectric structure penetrates the isolation region. Furthermore, if the dielectric structure includes the refill material having positive charge, a first leakage current from the N+ region of the NMOS transistor in the P-type well region to the N-type well region is decreased. If the dielectric structure includes the refill material having negative charge, a second leakage current from the P+ region of the PMOS transistor in the N-type well region to the P-type well region is decreased. Therefore, by adjusting the refill material of the dielectric structure, the first and second leakage currents can be decreased, thus prevent latch-up without modifying well implant condition of the P-type and N-type well regions.

In some embodiments, an SRAM structure is provided. The SRAM structure includes a substrate, a P-type well region over the substrate, an N-type well region over the substrate, a PMOS transistor in the N-type well region, an NMOS transistor in the P-type well region, an isolation layer over the boundary (or the junction, interface) between the P-type well region and the N-type well region, and a dielectric structure formed in the isolation layer and extending from the isolation region to the boundary (or the junction, interface) between the P-type well region and the N-type well region. The depth of the dielectric structure is greater than that of the isolation layer. The PMOS transistor is separated from the NMOS transistor by the isolation layer. A dielectric layer is disposed over the PMOS transistor and the NMOS transistor. In some instances, the dielectric structure extends from the N-type well region, through the isolation layer, and to a top surface of the dielectric layer.

In some embodiments, an SRAM structure is provided. A first pull-down transistor is formed in a first P-type well region over a substrate. A first pull-up transistor is formed in an N-type well region over the substrate. A second pull-down transistor is formed in a second P-type well region over the substrate, wherein the N-type well region is positioned between the first and second P-type well regions. A second pull-up transistor is formed in the N-type well region. A first pass-gate transistor formed in the first P-type well region. A second pass-gate transistor formed in the second P-type well region. A first dielectric structure formed at a first boundary (or first junction, first interface) between the first P-type well region and the N-type well region. A second dielectric structure formed at a second boundary (or second junction, second interface) between the second P-type well region and the N-type well region. Gate electrodes of the first pass-gate transistor and the second pull-up transistor are separated by the first isolation structure, and gate electrodes of the second pass-gate transistor and the first pull-up transistor are separated by the first isolation structure.

In some embodiments, a method for forming a SRAM structure is provided. The method includes forming a first fin structure over a substrate and forming an isolation structure around the first fin structure. The method further includes forming a first gate stack line across the first fin structure and extending over the isolation structure and forming a trench through the first gate stack line and the isolation structure and extending into the substrate. The method further includes filling the trench with a first dielectric material to form a dielectric structure separating the first gate stack line into a first gate structure and a second gate structure.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
      a first fin disposed over an n-type well and extending lengthwise along a first direction,
      a second fin and a third fin disposed over a p-type well abutting the n-type well and extending lengthwise along the first direction,
      an isolation feature disposed between the first fin and the second fin,
      a first gate structure, a second gate structure, a third gate structure, and a fourth gate structure spanning over the first fin, the second fin, the third fin, and the isolation feature and extending lengthwise along a second direction perpendicular to the first direction;
   forming a patterned mask over the first gate structure, the second gate structure, the third gate structure, and the fourth gate structure, the patterned mask comprising an opening that spans over the second gate structure and the third gate structure and is disposed directly over an interface between the n-type well and the p-type well;
   performing a first etch process using the patterned mask as an etch mask to form a trench that substantially terminates on a top surface of the isolation feature;
   performing a second etch process using the patterned mask as an etch mask to extend the trench completely through the isolation feature to form an extended trench; and
   depositing a negatively charged dielectric material in the extended trench.

2. The method of claim 1, wherein the workpiece further comprises an interlayer dielectric (ILD) layer disposed between adjacent ones of the first gate structure, the second gate structure, the third gate structure, and the fourth gate structure.

3. The method of claim 2,
   wherein the extended trench separates the second gate structure into a first segment and a second segment,
   wherein the extended trench separates the third gate structure into a third segment and a fourth segment.

4. The method of claim 3,
   wherein the extended trench comprises a first portion disposed between the first segment and the second segment, a second portion disposed in the ILD layer, and a third portion disposed between the third segment and the fourth segment,
  wherein a width of the first portion along the second direction is greater than a width of the second portion along the second direction.

5. The method of claim 1, wherein the extended trench is spaced apart from the first gate structure and the fourth gate structure.

6. The method of claim 1, wherein the performing of the second etch process extends a portion of the trench between the n-type well and the p-type well.

7. The method of claim 1,
  wherein the first etch process etches the second gate structure and the third gate structure faster than it does the isolation feature,
  wherein the second etch process etches the isolation feature faster than it does second gate structure and the third gate structure.

8. A method, comprising:
  receiving a workpiece comprising:
    a substrate comprising an n-type well and a p-type well abutting the n-type well at an interface that extends along a first direction,
    an isolation feature disposed over the n-type well and the p-type well,
    a first gate structure, a second gate structure, a third gate structure, and a fourth gate structure disposed over the isolation feature and extending lengthwise along a second direction perpendicular to the first direction, and
    an interlayer dielectric (ILD) layer disposed between adjacent ones of the first gate structure, the second gate structure, the third gate structure, and the fourth gate structure;
  forming an extended trench directly over the interface to separate the second gate structure into a first segment and a second segment and the third gate structure into a third segment and a fourth segment, the extended trench terminating in the substrate; and
  depositing a positively charged dielectric material in the extended trench,
  wherein the extended trench comprises a first portion disposed between the first segment and the second segment and a second portion disposed in the ILD layer,
  wherein a width of the first portion along the second direction is greater than a width of the second portion along the second direction.

9. The method of claim 8, wherein the forming of the extended trench comprising:
  forming a patterned mask over the first gate structure, the second gate structure, the third gate structure, the fourth gate structure and the ILD layer, the patterned mask comprising an opening that spans over the second gate structure and the third gate structure and is disposed directly over the interface;
  performing a first etch process using the patterned mask as an etch mask to form a trench that substantially terminates on a top surface of the isolation feature; and
  performing a second etch process using the patterned mask as an etch mask to extend the trench completely through the isolation feature to form an extended trench.

10. The method of claim 9, wherein, after the second etch process and before the depositing of the positively charged dielectric material, a native oxide layer is formed along surfaces of the extended trench.

11. The method of claim 10, wherein the depositing of the positively charged dielectric material comprises depositing the positively charged dielectric material on the native oxide layer.

12. The method of claim 8, wherein the first gate structure, the second gate structure, third gate structure, and the fourth gate structure comprise aluminum (Al), copper (Cu), tungsten (W), titanium (Ti), or tantalum (Ta).

13. A method for manufacturing a Static Random Access Memory (SRAM) structure, comprising:
  forming a first fin structure over a substrate;
  forming an isolation structure around the first fin structure;
  forming an interlayer dielectric (ILD) layer over the isolation structure forming a first gate stack line across the first fin structure and extending over the isolation structure such that the first gate stack line is surrounded by the ILD layer;
  forming a trench through the first gate stack line and the isolation structure and extending into the substrate; and
  filling the trench with a first dielectric material to form a dielectric structure separating the first gate stack line into a first gate structure and a second gate structure aligned with the first gate structure along a direction,
  wherein the dielectric structure comprises a first portion disposed between the first gate structure and the second gate structure and a second portion disposed in the ILD layer,
  wherein a width of the first portion along the direction is greater than a width of the second portion along the direction.

14. The method as claimed in claim 13, further comprising:
  forming a second fin structure over the substrate, wherein the first fin structure is formed over a first-type well region, and the second fin structure is formed over a second-type well region; and
  forming a second gate stack line across the first fin structure and the second fin structure and extending over the isolation structure,
  wherein the trench is formed through the second gate stack line, so that the dielectric structure separates the second gate stack line into a third gate structure and a fourth gate structure.

15. The method as claimed in claim 14, wherein the trench exposes an interface of the first-type well region and the second-type well region.

16. The method as claimed in claim 14, further comprising:
  forming an interlayer dielectric layer between the first gate stack line and the second gate stack line, wherein the trench continuously extends cross the first gate stack line and the second gate stack line to separate the interlayer dielectric layer into two portions.

17. The method as claimed in claim 14, wherein the dielectric structure comprises a first portion between the first gate structure and the second gate structure, a second portion between the third gate structure and the fourth gate structure, and a third portion between the first portion and the second portion, and a bottom of the first portion of the dielectric structure is lower than a bottom of the third portion of the dielectric structure.

18. The method as claimed in claim 13, wherein the trench is formed by etching the first gate stack line, the isolation structure, and the substrate, and a native oxide layer is formed on sidewalls and bottom surface of the trench before filling the first dielectric material.

19. The method as claimed in claim 13, further comprising:
depositing a second dielectric material on sidewalls and a bottom surface of the trench before filling the first dielectric material, wherein the first dielectric material is different from the second dielectric material.

20. The method as claimed in claim 13, wherein forming the trench further comprises:
etching the first gate stack line until the isolation structure is exposed by performing a first etching process; and
etching the isolation structure and the substrate by performing a second etching process,
wherein a first etchant used in the first etching process is different from a second etchant used in the second etching process.

\* \* \* \* \*